United States Patent
Yamagami

(10) Patent No.: US 7,508,238 B2
(45) Date of Patent: Mar. 24, 2009

(54) SEMICONDUCTOR INTEGRATED CIRCUIT DEVICE

(75) Inventor: Minoru Yamagami, Tokyo (JP)

(73) Assignee: Elpida Memory, Inc., Tokyo (JP)

(*) Notice: Subject to any disclaimer, the term of this patent is extended or adjusted under 35 U.S.C. 154(b) by 580 days.

(21) Appl. No.: 11/194,683

(22) Filed: Aug. 2, 2005

(65) Prior Publication Data

US 2006/0027835 A1    Feb. 9, 2006

(30) Foreign Application Priority Data

Aug. 9, 2004    (JP) .............................. 2004-232454

(51) Int. Cl.
*H01L 25/065* (2006.01)
*H01L 23/48* (2006.01)

(52) U.S. Cl. ..................... 326/103; 326/47; 326/41; 257/203; 257/211; 257/E25.01; 257/E23.011

(58) Field of Classification Search ............... 326/41, 326/47, 103; 257/203, 211, E25.01, E23.011
See application file for complete search history.

(56) References Cited

U.S. PATENT DOCUMENTS 6,404,226 B1 * 6/2002 Schadt ..................... 326/41
7,034,384 B2 * 4/2006 Tsai ......................... 257/678
2005/0270829 A1 * 12/2005 Ooishi ....................... 365/158

FOREIGN PATENT DOCUMENTS

| JP | 5-198680 | | 8/1993 | |
| JP | 6-216247 | | 8/1994 | |
| JP | 2000-236063 A | | 8/2000 | |
| JP | 2000-299382 A | | 10/2000 | |
| JP | 2000299382 | * | 10/2000 | ........... 21/82 |
| JP | 2002-319665 A | | 10/2002 | |

* cited by examiner

*Primary Examiner*—Victor A Mandala
(74) *Attorney, Agent, or Firm*—McDermott Will & Emery LLP

(57) ABSTRACT

A semiconductor integrated circuit device includes a main region on which a main circuit is formed and a spare cell region for logic modification of the circuit formed on the main region. The spare cell region includes a P-channel transistor region, an N-channel transistor region, a plurality of gate electrodes provided above the P-channel transistor region and the N-channel transistor region, a main wire layer that is a different layer from the gate electrodes, and a plurality of bypass wires that are formed at a different layer from the main wire layer. Each of the plurality of bypass wires has a structure that can be connected to the main wire layer at more than one point through contact holes formed in a dielectric layer intervening between the main wire layer and the bypass wires.

20 Claims, 38 Drawing Sheets

SEMICONDUCTOR INTEGRATED CIRCUIT DEVICE

TECHNICAL FIELD

The present invention relates to a semiconductor integrated circuit device, and more particularly to a semiconductor integrated circuit device that employs a spare cell region that enables the operation of a main circuit formed on a main region to be changed during or after designing the device.

BACKGROUND OF THE INVENTION

Correcting or modifying a designed logic circuit (hereinafter termed "logic modification") of a semiconductor integrated circuit device during or after designing the device is often required owing to design error, change in process conditions, and so forth.

In such case, an optimum transistor layout can be obtained after the logic modification by adding the newly required transistors. This method, however, has a disadvantage in that process correction is required as far back as the diffusion process because transistors are newly added. This means that almost all photomasks used during the photolithography processes must be changed and, therefore, not only does the manufacturing cost increase markedly but the time required to complete the modification becomes long. Recent years have seen not only an increase in the cost of photomasks owing to advances in fine processing technology but also a need for shorter turnaround time. This conventional method is therefore not practical in the light of current circumstances.

To solve this problem, Japanese patent application laid open No. H5-198680 discloses a method that provides the spare transistors needed for logic modification in advance. According to this method, the logic modification can be performed without changing the photomasks used during the diffusion process and the gate electrode forming process. However, this method also has a disadvantage in that the process correction is required as far back as the gate electrode forming process and almost all of the successive processes have to be changed. This results in increased cost and longer turnaround time.

On the other hand, Japanese patent application laid open No. 2002-319665, which relates to a semiconductor integrated circuit of the gate array type, discloses a method in which wiring patterns are independently provided above the CMOS basic cells in advance in order to mitigate the wiring density. However, this method is not sufficient for avoiding a marked increase in cost and turnaround time because it has a disadvantage in that process correction is required as far back as the process of forming the contact holes used to connect to the wiring patterns.

Although other logic modification methods for the semiconductor integrated circuit device are disclosed in Japanese patent application laid open No. 2000-299382, Japanese patent application laid open No. 2000-236063, and Japanese patent application laid open No. H6-216247, it is impossible or very difficult to add a complex logic circuit by these methods.

As set out above, according to the prior art it is difficult to avoid marked increase in cost and turnaround time when logic modification of a semiconductor integrated circuit device is required, particularly when addition of complex logic circuits is required, during or after designing the device.

SUMMARY OF THE INVENTION

It is therefore an object of the present invention to provide a semiconductor integrated circuit device having such a layout that logic modification can be easily performed even if the logic modification is required during or after designing the device.

Another object of the present invention is to provide a semiconductor integrated circuit device having such a layout that complex circuits can be easily added by performing logic modification during or after designing the device.

The above and other objects of the present invention can be accomplished by a semiconductor integrated circuit device comprising a main region on which a main circuit is formed and a spare cell region for logic modification of the circuit formed on the main region, wherein said spare cell region includes a P-channel transistor region, an N-channel transistor region, a plurality of gate electrodes provided above the P-channel transistor region and the N-channel transistor region, a main wire layer that is a different layer from the gate electrodes, and a plurality of bypass wires that are formed at a different layer from the main wire layer, each of said plurality of bypass wires having a structure that can be connected to the main wire layer at more than one point through contact holes formed in a dielectric layer intervening between the main wire layer and the bypass wires.

According to the present invention, complex logic circuits can be formed without substantial difficulty because the main wire layer can include, for example, a wiring portion that intersects with the bypass wires. Further, because the bypass wires have a structure that can be connected to the main wire layer at more than one point in advance, it is not necessary to design new contact holes for establishing the connection between the main wires and the bypass wires during the logic modification process. The logic modification process can therefore be performed relatively easily. In particular, in the case where the bypass wires have a structure that can be connected to the main wires layer at more than two points, more complex logic circuits can be added.

Moreover, when the diffusion regions included in the P-channel transistor region and the N-channel transistor region are connected to the main wire layer in advance, it is not necessary to design new contact holes for establishing the connection between the main wires and the diffusion regions. In this case, portions of the main wire layer connected to the diffusion regions are preferably spaced so that a wire of the main wire layer used for wiring can pass. According to this arrangement, because the wire layer can include a wire along the gate electrode, more complex logic circuits can be added.

Furthermore, when the gate electrodes are connected to the main wire layer in advance, it is not necessary to design new contact holes for establishing the connection between the main wires and the gate electrodes. In this case, portions of the main wire layer connected to the gate electrodes are preferably spaced so that that a wire of the main wire layer used for wiring can pass. According to this arrangement, because a wire passing between two main wires connected to the adjacent gate electrodes can be formed, more complex logic circuits can be added.

It is preferably for the spare cell region to include a plurality of P-channel transistor regions and plurality of N-channel transistor regions. This enables the driving capability of the logic circuit to be easily controlled. In particular, when at least two P-channel transistor regions have a different channel width from each other and at least two N-channel transistor regions have a different channel width from each other, the driving capability of the logic circuit can be finely controlled.

As set out above, according to the present invention, the logic modification of a semiconductor integrated circuit device can be easily performed by adding complex logic circuits even if the logic modification is required during or after designing the device. Therefore, the manufacturing cost of the semiconductor integrated circuit device can be decreased and the logic modification can be accomplished in a short time.

BRIEF DESCRIPTION OF THE DRAWINGS

The above and other objects, features and advantages of the present invention will become more apparent by reference to the following detailed description of the invention taken in conjunction with the accompanying drawings, wherein:

FIG. 2A is schematic sectional view showing the structure of a plug electrode filling a contact hole 200a;

DETAILED DESCRIPTION OF THE EMBODIMENTS

Preferred embodiments of the present invention will now be explained in detail with reference to the drawings.

Figure 1:
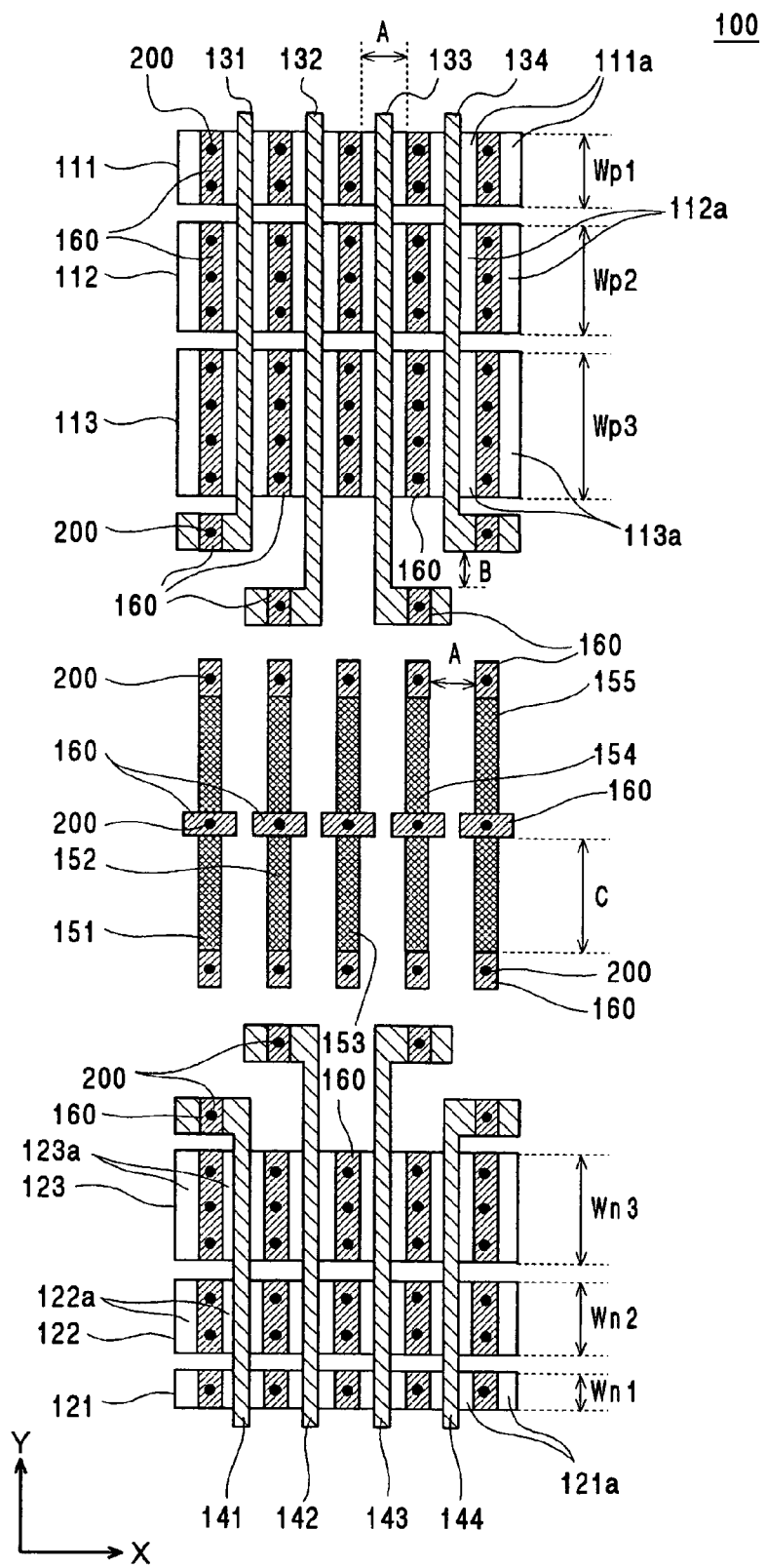
FIG. 1 is a schematic plan view showing the structure of a spare cell region employed in the semiconductor integrated circuit device according to a preferred embodiment of the present invention.

FIG. 1 is a schematic plan view showing the structure of a spare cell region employed in the semiconductor integrated circuit device according to a preferred embodiment of the present invention As termed with respect to this invention, a "spare cell region" means a region prepared separately from a main region on which a main circuit such as a DRAM (Dynamic Random Access Memory) circuit is formed. The spare cell region is used when logic modification of the main circuit formed on the main region is required during or after designing the device. Although the spare cell region can be positioned at any area of the semiconductor integrated circuit device, it is preferable for a plurality of spare cell regions to be positioned at different areas so as to be able to perform logic modification in more cases. When the spare cell region is positioned at a free space of the semiconductor integrated circuit device, the chip area does not increase owing to provision of the spare cell region.

As shown in FIG. 1, this embodiment a spare cell region 100 is constituted of three P-channel transistor regions 111 to 113, three N-channel transistor regions 121 to 123, four gate electrode 131 to 134 for P-channel transistors located across the P-channel transistor regions 111 to 113, four gate electrode 141 to 144 for N-channel transistors located across the N-channel transistor regions 121 to 123, five bypass wires 151 to 155 formed at a bypass wire layer that is a layer above a gate wire layer at which the gate electrodes 131 to 134 and 141 to 144 are formed, and main wires 160 formed at a main wire layer that is a layer above the bypass wire layer.

The P-channel transistor regions 111 to 113 are located in parallel and each is structured with the channel regions located below the gate electrode 131 to 134 (the channel regions are not visible in FIG. 1 because they are covered by the gate electrodes 131 to 134) and the P-channel diffusion regions 111a to 113a are arranged alternately in the X direction. In this embodiment, the relationship among the channel widths Wp1, Wp2 and Wp3 (distance in the Y direction) of the P-channel transistor regions 111 to 113 is set as follows:

$Wp1 < Wp2 < Wp3$

This enables the driving capability of the circuit formed in the spare cell region to be finely controlled.

Similarly, the N-channel transistor regions 121 to 123 are located in parallel and each is structured with the channel regions located below the gate electrode 141 to 144 (the channel regions are not visible in FIG. 1 because they are covered by the gate electrode 141 to 144) and the N-channel diffusion regions 121a to 123a are arranged alternately in the X direction. In this embodiment, the relationship among the channel widths Wn1, Wn2 and Wn3 (distance in the Y direction) of the N-channel transistor regions 121 to 123 is set as follows:

$Wn1 < Wn2 < Wn3$

This also enables the driving capability of the circuit formed in the spare cell region to be finely controlled.

The relationship of the channel widths between the P-channel transistor regions 111 to 113 and the N-channel transistor regions 121 to 123 is set as follows:

$Wn1 < Wp1$ $Wn2 < Wp2$ $Wn3 < Wp3$

This is a result of taking the difference of the driving capability between N-channel MOS transistors and P-channel MOS transistors into account.

Figure 2A:
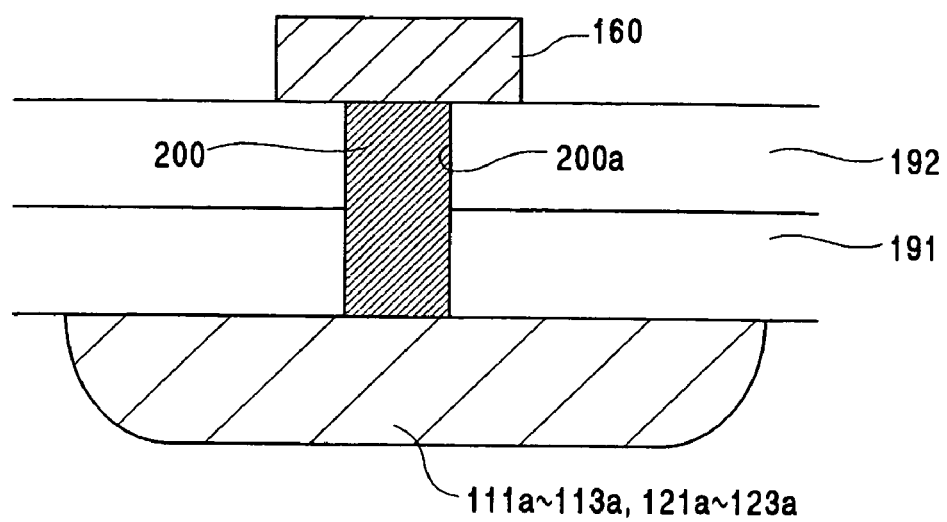
Figure 2B:
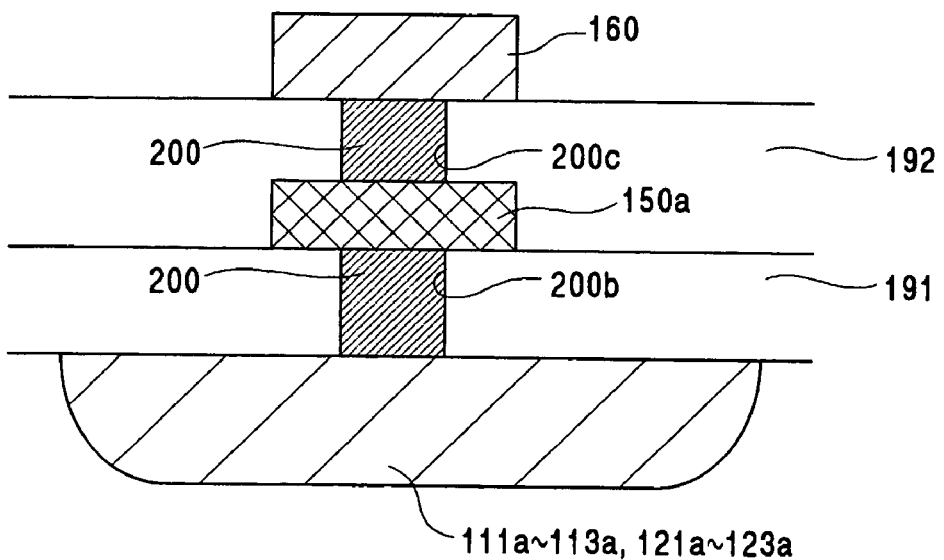
FIG. 2B is schematic sectional view showing the structure of a plug electrode filling contact holes 200b and 200c.

As shown in FIG. 1, all of the P-channel diffusion regions 111a to 113a and the N-channel diffusion regions 121a to 123a are connected to the main wires 160 via plug electrodes 200 (indicated by black dots in FIG. 1) filling the contact holes. As shown in FIG. 2A, the plug electrodes 200 may fill the contact holes 200a passing through both the dielectric layer 191 which isolates the gate wire layer from the bypass wire layer and the dielectric layer 192 which isolates the bypass wire layer from the main wire layer. Or, as shown in FIG. 2B, a part of the plug electrodes 200 may fill the contact holes 200b passing through the dielectric layer 191 so as to connect the diffusion regions (111a to 113 and 121a to 123a) to the electrode 150a formed in the bypass wire layer, and the other part of the plug electrodes 200 can fill the contact holes 200c passing through the dielectric layer 192 so as to connect the electrode 150a to the main wire 160. While there is no particular limit on the material of the plug electrodes 200, tungsten (W) can be preferably used.

The distance A between the main wires 160 in the X direction connected to the adjacent diffusion regions is set to a distance that can pass wires of the main wire layer used for wiring. This enables use of a wire of the main wire layer as the wire formed through the gate electrodes 131 to 134 for P-channel transistors or the gate electrodes 141 to 144 for N-channel transistors.

Because the gate electrodes 131 to 134 for P-channel transistors are located across the P-channel transistor regions 111 to 113, four P-channel MOS transistors are formed in series in each of the P-channel transistor regions 111 to 113. Similarly, because the gate electrodes 141 to 144 for N-channel transistors are located across the N-channel transistor regions 121 to 123, four N-channel MOS transistors are formed in series in each of the N-channel transistor regions 121 to 123.

As can be seen from FIG. 1, the gate electrodes 131 to 134 for P-channel transistors and the gate electrodes 141 to 144 for N-channel transistors are also connected to the main wires 160 via the plug electrodes 200 formed in the contact holes. Such plug electrodes 200 can have the structure shown in either FIG. 2A or FIG. 2B. In this embodiment, all the gate electrodes are L-shaped and connected to the main wires 160 at the short-length portion. Specifically, the gate electrodes (131 to 134 and 141 to 143) are connected to the main wires 160 at an extension in the array direction of the plug electrodes 200 that are connected to the diffusion regions (111a to 113a and 121a to 123a), whereby the design freedom of the main wires 160 is increased.

The distance B between the main wires 160 in the Y direction connected to the adjacent gate electrodes is set to a distance that can pass the wires of the main wire layer used for wiring. This enables a wire passing between two main wires 160 connected to the adjacent gate electrodes to be formed.

While there is no particular limit on the material of the gate electrodes (131 to 134 and 141 to 143), polycrystalline silicon is preferably used.

As set out above, the bypass wires 151 to 155 are formed at a bypass wire layer that is a layer above the gate wire layer. The bypass wires 151 to 155 are located in parallel with the gate electrodes (131 to 134 and 141 to 143) and are located at an extension in the array direction of the plug electrodes 200 that are connected to the diffusion regions (111*a* to 113*a* and 121*a* to 123*a*).

As shown in FIG. 1, all the bypass wires 151 to 155 are connected to the main wires 160 via the plug electrodes 200 formed in the contact holes. In this embodiment, all the bypass wires 151 to 155 are connected to the main wires 160 at three points: one end on the P-channel transistor region side (upper end in FIG. 1); the opposite end on the N-channel transistor region side (lower end in FIG. 1); and the intermediate portion. The invention is not limited to the bypass wires being connected to the main wires at three points, but it suffices for the bypass wires to be connected to the main wires at more than one point. However, when the bypass wires are connected to the main wires at three points, more complex circuits can be designed because the design freedom of the main wires 160 is increased. It is also of course possible to connect the bypass wires to the main wires at four or more points.

According to this embodiment, the distance C between the main wires 160 in the Y direction connected to the intermediate portions of the bypass wires 151 to 155 and the end portions of the bypass wires 151 to 155 is set to a distance that can pass a plurality of wires (e.g., three wires) of the main wire layer used for wiring. This enables a plurality of wires 160 to be formed across the bypass wires 151 to 155, whereby more a complex circuit, e.g., a multi-input logic circuit, can be designed.

The distance A between the main wires 160 in the X direction connected to the end portion of the bypass wires 151 to 155 is set to a distance that can pass the wires of the main wire layer used for wiring. This also enables a wire passing between two main wires 160 connected to the bypass wires 151 to 155 to be formed.

While there is no particular limit on the material of the bypass wires 151 to 155, tungsten (W) is preferably used.

The main wires 160 are formed at a main wire layer that is a layer above the bypass wire layer. As an apparent from the foregoing, the main wires 160 include the portions connected to the diffusion regions (111*a* to 113*a* and 121*a* to 123*a*), the portions connected to the gate electrodes (131 to 134 and 141 to 143), and the portions connected to the bypass wires 151 to 155. While there is no particular limit on the material of the main wires 160, aluminum (Al) is preferably used.

This is a basic configuration of the spare cell region according to this embodiment. In the case where logic modification is required in a main circuit such as a DRAM circuit, the wiring pattern of the main wire layer in the spare cell region is modified so as to add the necessary logic circuits. However, because the main wire layer is only modified in the spare cell region, no modification in the other wire layers (i.e., gate wire layer and bypass wire layer) or contact holes is necessary. Therefore, in the case where logic modification of the main circuit formed on the main region is required during or after designing the device, the required modification can be achieved by only changing a photomask used to form the main wire layer.

Specific examples of logic modification by changing the pattern of the main wire layer will now be explained in detail.

Figure 3:
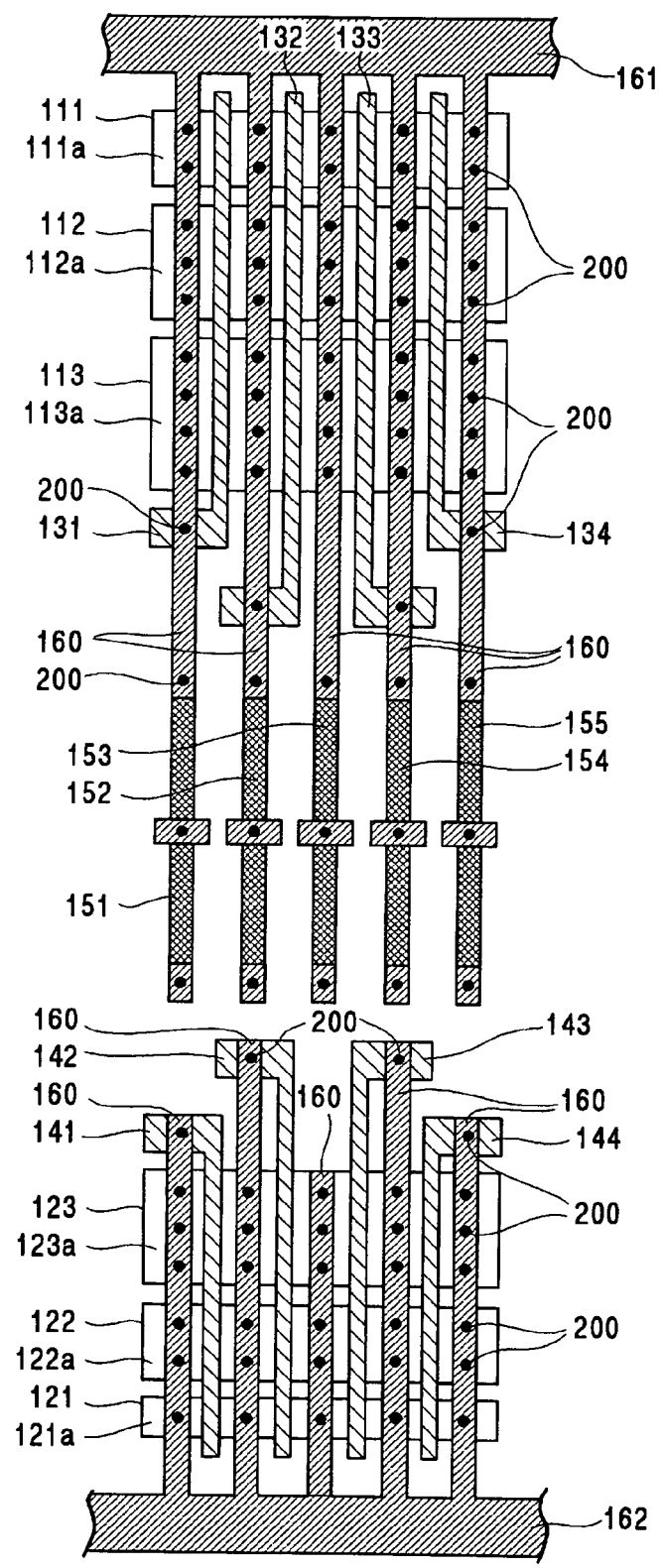
FIG. 3 is a schematic plan view showing the pattern of the main wire layer in the case where the spare cell region is not used.

FIG. 3 is a schematic plan view showing the pattern of the main wire layer in the case where the spare cell region is not used.

As shown in FIG. 3, in the case where the spare cell region is not used, i.e., in the case where logic modification in the main region is not necessary, all of the P-channel diffusion regions 111*a* to 113*a* and the gate electrodes 131 to 134 for P-channel transistors are connected to the power supply line 161, and all of the N-channel diffusion regions 121*a* to 123*a* and the gate electrodes 141 to 144 for N-channel transistors are connected to the ground line 162 using the main wires 160. The power supply line 161 and the ground line 162 are formed on the main wire layer.

Thus, all of the P-channel MOS transistors formed in the P-channel transistor regions 111 to 113 are in the OFF state because the power supply potential is applied to all of their gates, sources and drains. Similarly, all of the N-channel MOS transistors formed in the N-channel transistor regions 121 to 123 are in the OFF state because the ground potential is applied to all of their gates, sources and drains. This results in the spare cell region being unused and the spare cell region does not affect other circuits.

Further, all of the main wires 160 connected to the bypass wires 151 to 155 are connected to the power supply line 161 so that a floating state of the bypass wires 151 to 155 is avoided. The bypass wires 151 to 155 can be connected to the ground line 162 instead of the power supply line 161.

Figure 4:
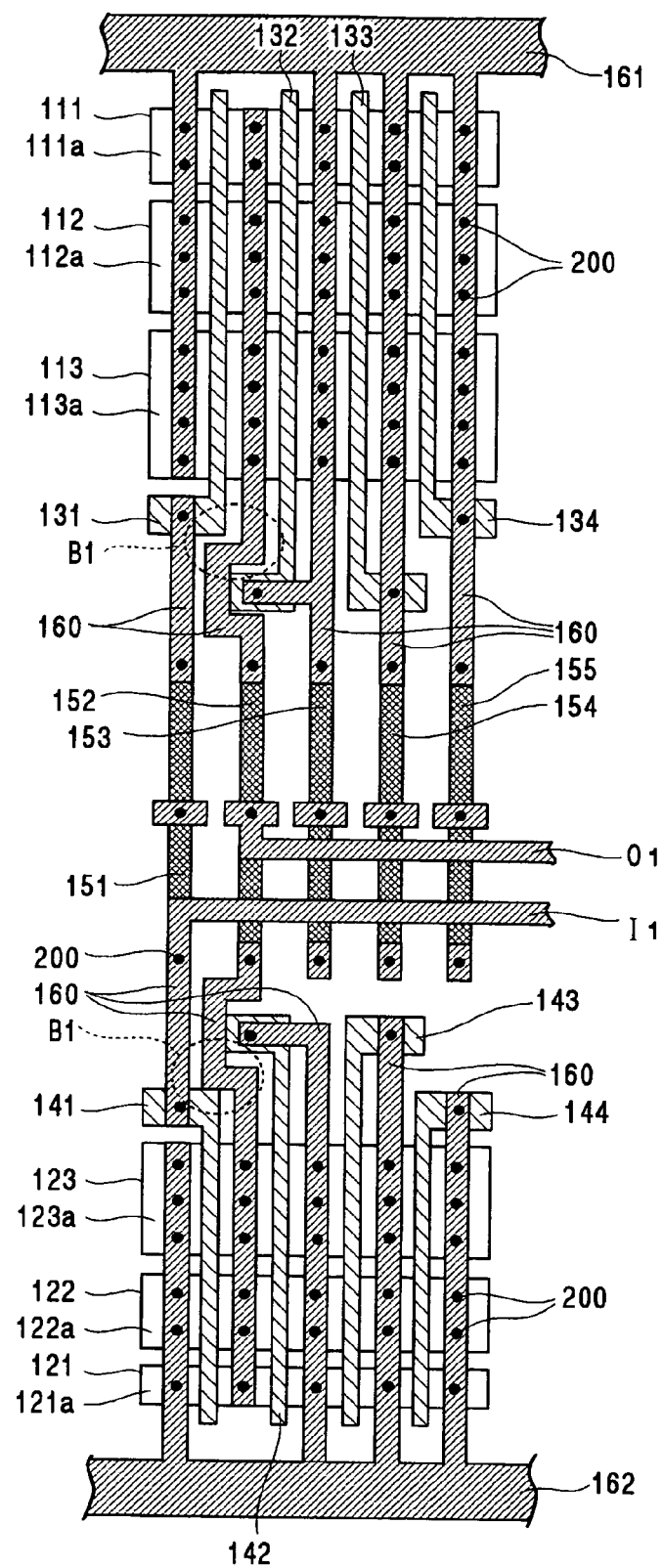
FIG. 4 is a schematic plan view showing the pattern of the main wire layer in the case where an inverter circuit is formed in the spare cell region.

FIG. 4 is a schematic plan view showing the pattern of the main wire layer in the case where an inverter circuit is formed in the spare cell region. A symbol diagram and a circuit diagram of the inverter circuit are shown in FIG. 5A and FIG. 5B, respectively.

As shown in FIG. 4, in order to form the inverter circuit in the spare cell region, a main wire 160 used as an input signal line $I_1$ is connected to the bypass wire 151 and a main wire 160 used as an output signal line $O_1$ is connected to the bypass wire 152. Further, the bypass wire 151 is connected to both the gate electrode 131 for P-channel transistor and the gate electrode 141 for N-channel transistor using a main wire 160, and a main wire 160 used as the bypass wire 152 is connected to all of the P-channel diffusion regions 111*a* to 113*a* that serve as a drain and the N-channel diffusion regions 121*a* to 123*a* that serve as a drain. Furthermore, the P-channel diffusion regions 111*a* to 113*a* that serve as a source are all connected to the power supply line 161, and the N-channel diffusion regions 121*a* to 123*a* that serve as a source are all connected to the ground line 162.

Figure 5A:
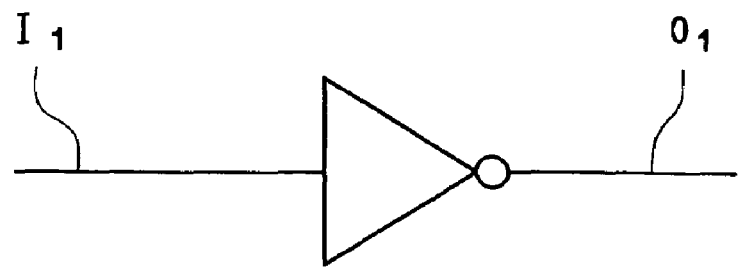
FIG. 5A is a symbol diagram of the inverter circuit.
Figure 5B:
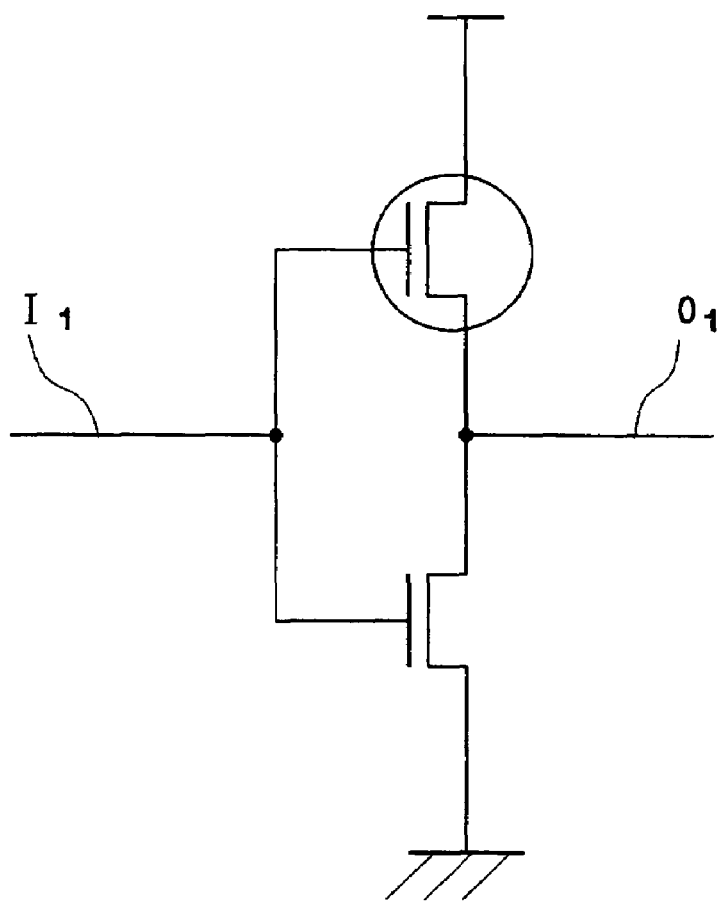
FIG. 5B is a circuit diagram of the inverter circuit.

Thus, the inverter circuit shown in FIG. 5A and FIG. 5B is formed in the spare cell region. According to this arrangement, because three P-channel MOS transistors and three N-channel MOS transistors are used in parallel, the inverter has relatively large driving capability.

Unused portions of the P-channel diffusion regions 111*a* to 113*a* and the gate electrodes 132 to 134 for P-channel transistors are connected to the power supply line 161, and unused portions of the N-channel diffusion regions 121*a* to 123*a* and the gate electrode 142 to 144 for N-channel transistors are connected to the ground line 162 using the main wires 160. Thus, the unused portions of the spare cell region have no effect on other circuits.

In this example, although the main wires 160 extend in the X direction in the area B1 shown in FIG. 4, the main wires 160 can pass through the area B1 because, as set out above, the distance B between the main wires 160 in the Y direction connected to the adjacent gate electrodes is set to a distance that can pass the wires of the main wire layer used for wiring. Further, in this example, although two main wires 160 (input signal line $I_1$ and output signal line $O_1$) intersect above the bypass wires 152 to 155, these main wires 160 can pass through this area because the distance C between the main wires 160 in the Y direction connected to the intermediate portions of the bypass wires 151 to 155 and the end portions of the bypass wires 151 to 155 is set to the distance that can pass a plurality of wires of the main wire layer used for wiring.

Figure 6:
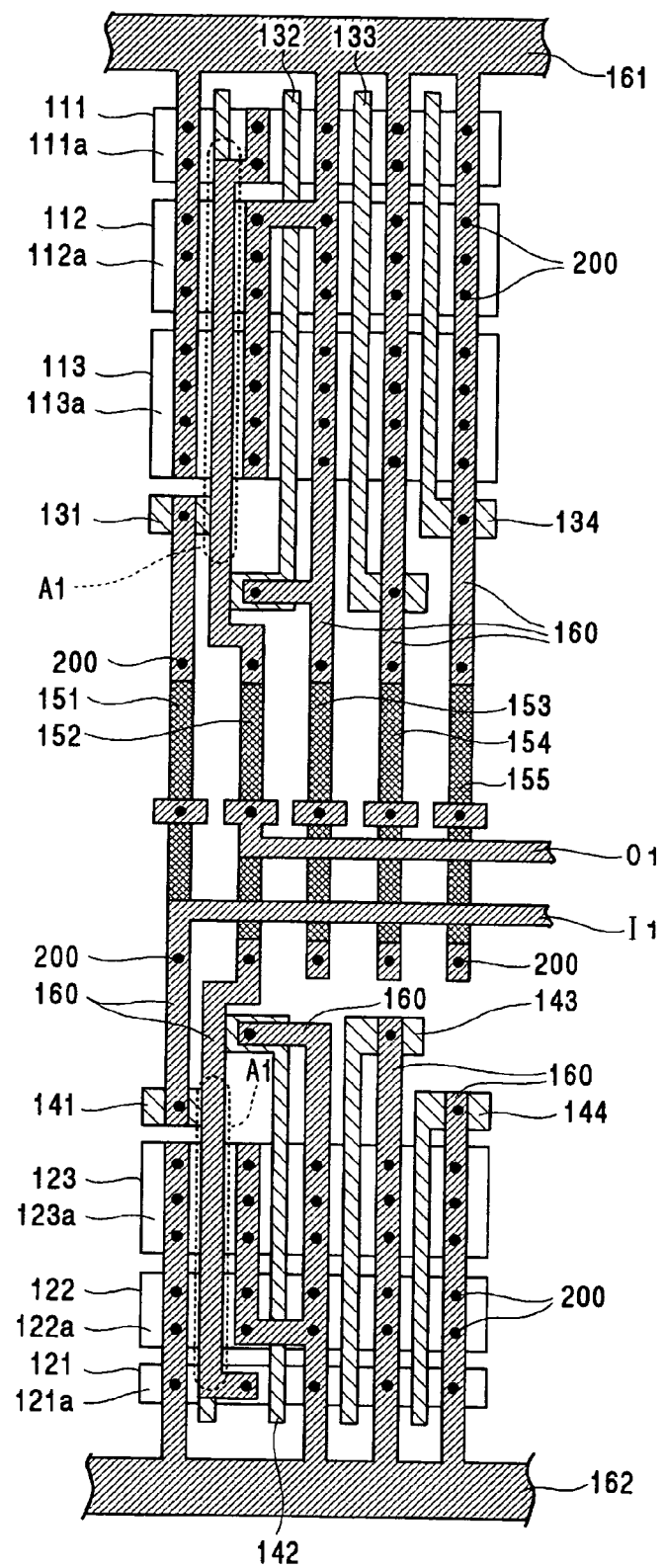
FIG. 6 is a schematic plan view showing another pattern of the main wire layer in the case where the inverter circuit is formed in the spare cell region.

FIG. 6 is a schematic plan view showing another pattern of the main wire layer in the case where an inverter circuit is formed in the spare cell region. In this example an inverter circuit having a small driving capability is added.

In order to form the inverter circuit having a small driving capability in the space cell region, a P-channel MOS transistor should be constituted using only the P-channel transistor region 111 and an N-channel MOS transistor should be constituted using only the N-channel transistor region 121 as shown in FIG. 6. These MOS transistors form the same logic circuit as shown in FIGS. 5A and 5B (inverter circuit). However, because the P-channel transistor region 111 and the N-channel transistor region 121 have the narrowest channel width, the driving capability of this inverter becomes relatively small.

In this example, although the main wires 160 extend in the Y direction in the area A1 as shown in FIG. 6, the main wires 160 can pass through the area A1 because the distance A between the main wires 160 in the X direction connected to the adjacent diffusion regions is set to a distance that can pass the wires of the main wire layer used for wiring.

Figure 7:
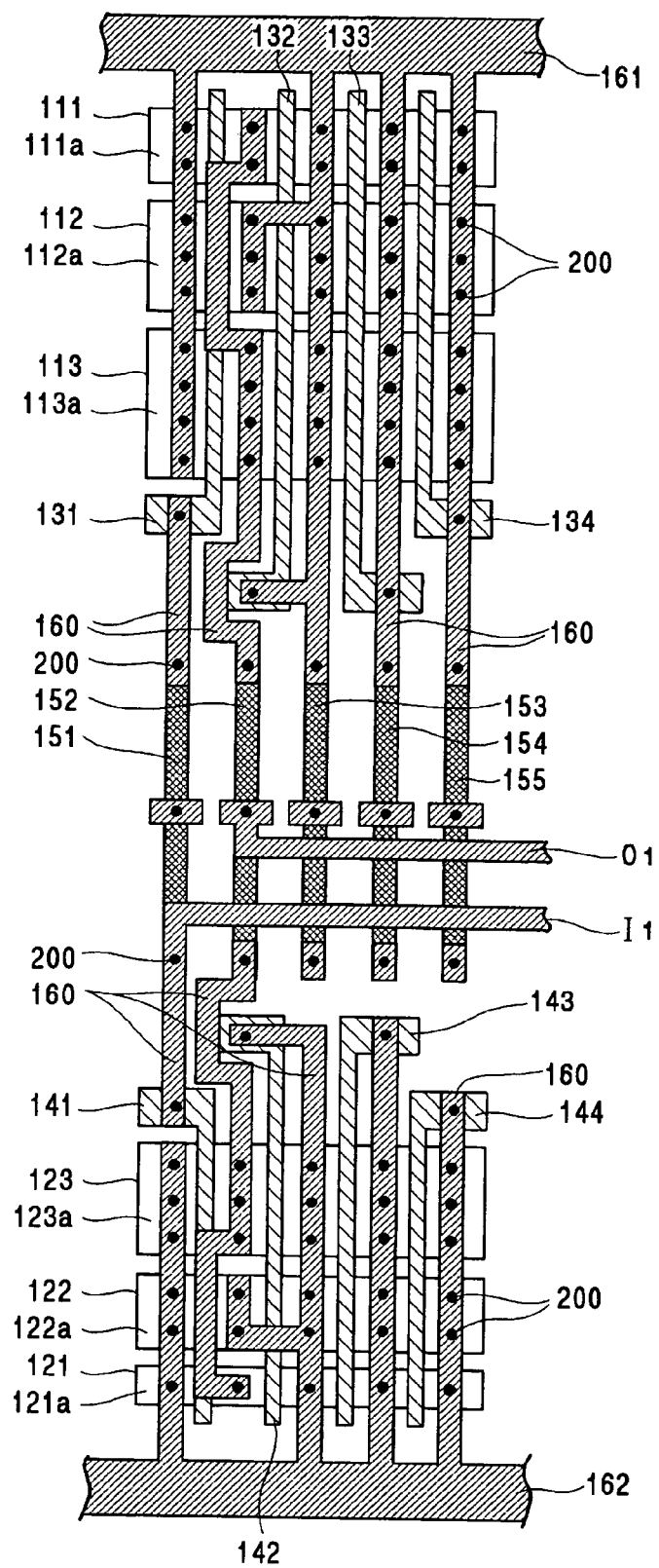
FIG. 7 is a schematic plan view showing still another pattern of the main wire layer in the case where the inverter circuit is formed in the spare cell region.

FIG. 7 is a schematic plan view showing still another pattern of the main wire layer in the case where the inverter circuit is formed in the spare cell region. This example shows an inverter circuit having a moderate driving capability.

In order to form the inverter circuit having a moderate driving capability in the space cell region, a P-channel MOS transistor should be constituted using two P-channel transistor regions 111 and 113 and an N-channel MOS transistor should be constituted using two N-channel transistor region 121 and 123 as shown in FIG. 7. These MOS transistors form the same logic circuit as shown in FIGS. 5A and 5B (inverter circuit). However, because two P-channel transistor regions 111 and 113 are used in parallel and two N-channel transistor regions 121 and 123 are used in parallel, the inverter get moderate driving capability.

Moreover, various inverter circuits can be formed according to the required driving capability, for example, by using only P-channel transistor region 112 and N-channel transistor region 122 or by using two P-channel transistor regions 112 and 113 in parallel and two N-channel transistor regions 122 and 123 in parallel. Further, rise characteristics and fall characteristics of the output signal of inverter circuits can be controlled by setting the driving capability of the P-channel MOS transistor and N-channel MOS transistor differently.

Some examples of forming other types of logic circuits will now be explained.

Figure 8:
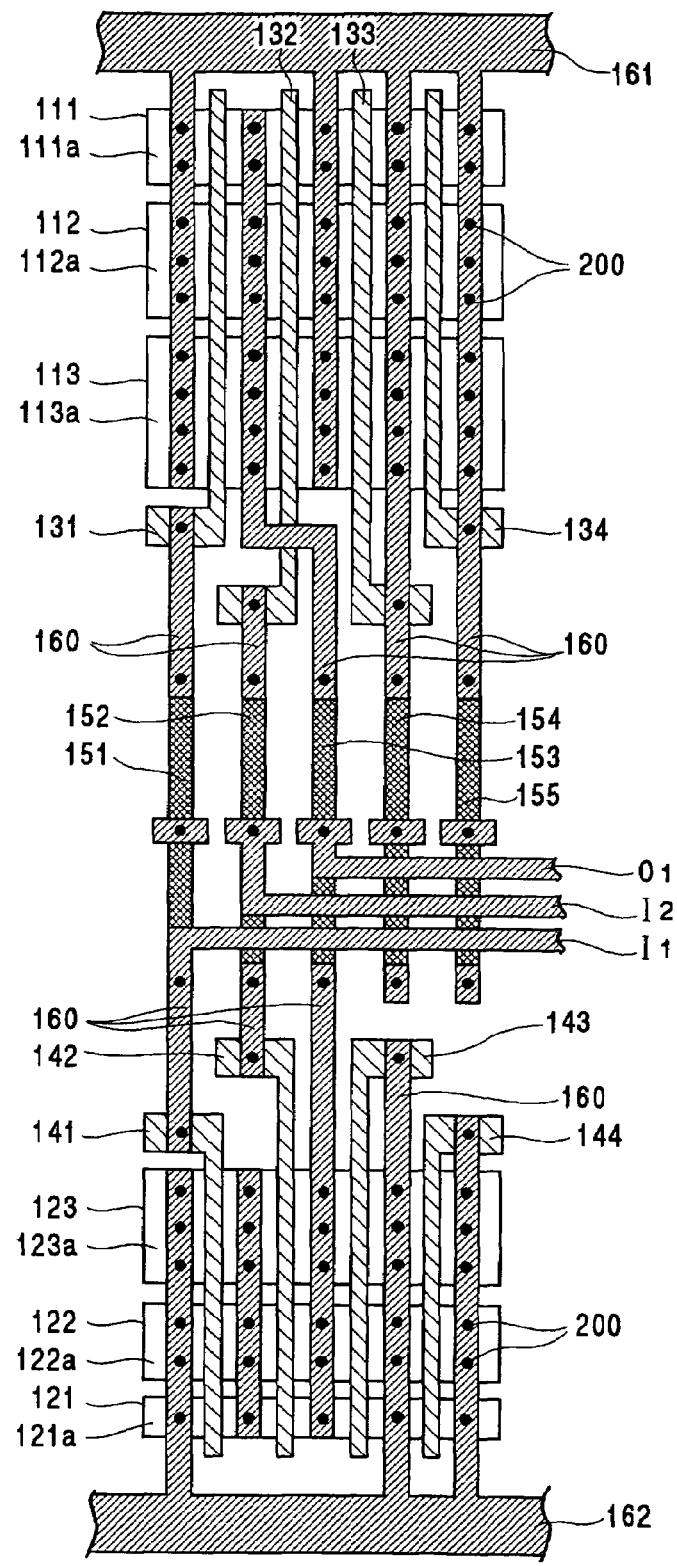
FIG. 8 is a schematic plan view showing the pattern of the main wire layer in the case where a NAND circuit of 2-input type is formed in the spare cell region.
Figure 9A:
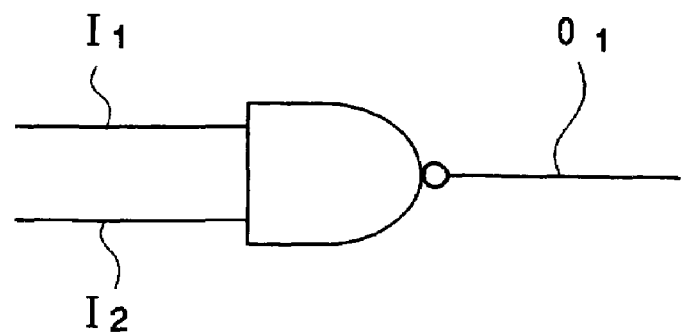
FIG. 9A is a symbol diagram of the NAND circuit of 2-input type.
Figure 9B:
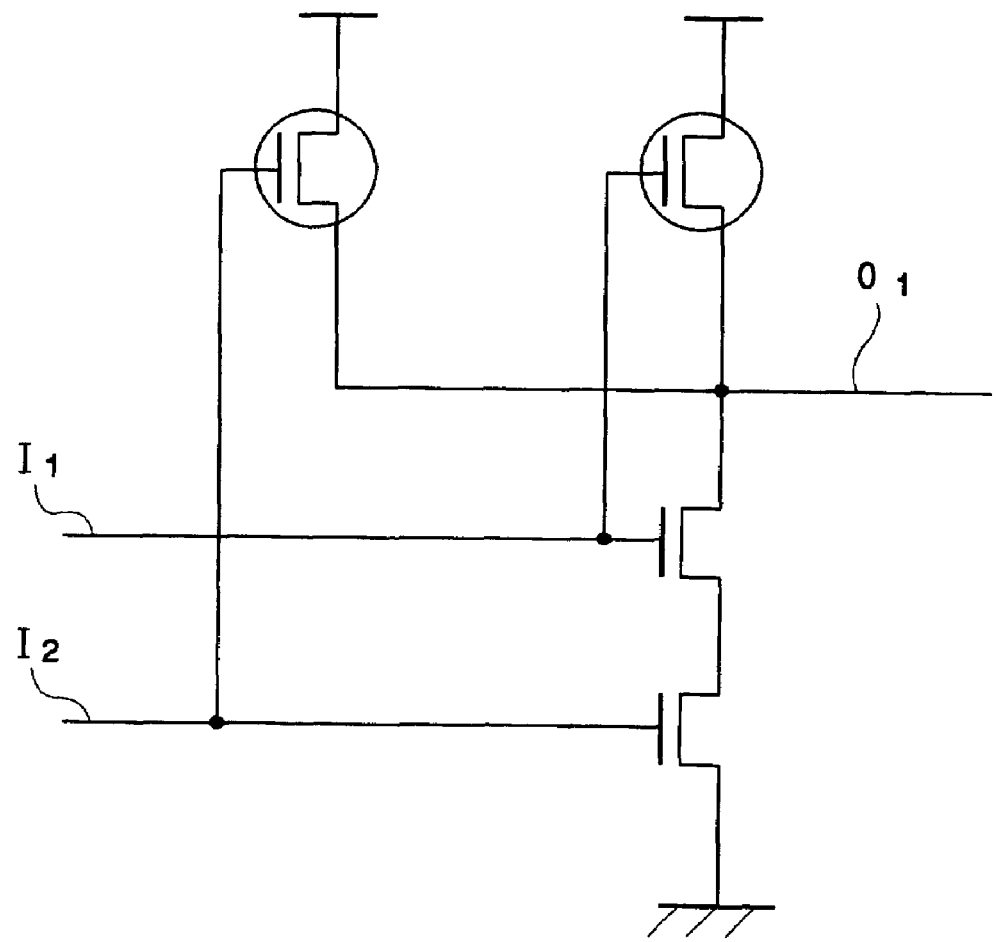
FIG. 9B is a circuit diagram of the NAND circuit of 2-input type.

FIG. 8 is a schematic plan view showing the pattern of the main wire layer in the case where a NAND circuit of 2-input type is formed in the spare cell region. A symbol diagram and a circuit diagram of the NAND circuit of 2-input type are shown in FIG. 9A and FIG. 9B, respectively. In this example, using three bypass wires 151 to 153, the NAND circuit is implemented using the main wires 160 to connect two P-channel MOS transistors in parallel located at an extension of the bypass wires 151 to 153 in Y direction and to connect two N-channel MOS transistors in serial located at opposite extension. As shown in FIG. 8, three main wires 160 (first input signal line $I_1$, second input signal line $I_2$ and output signal line $O_1$) intersect above the bypass wires 153 to 155.

Figure 10:
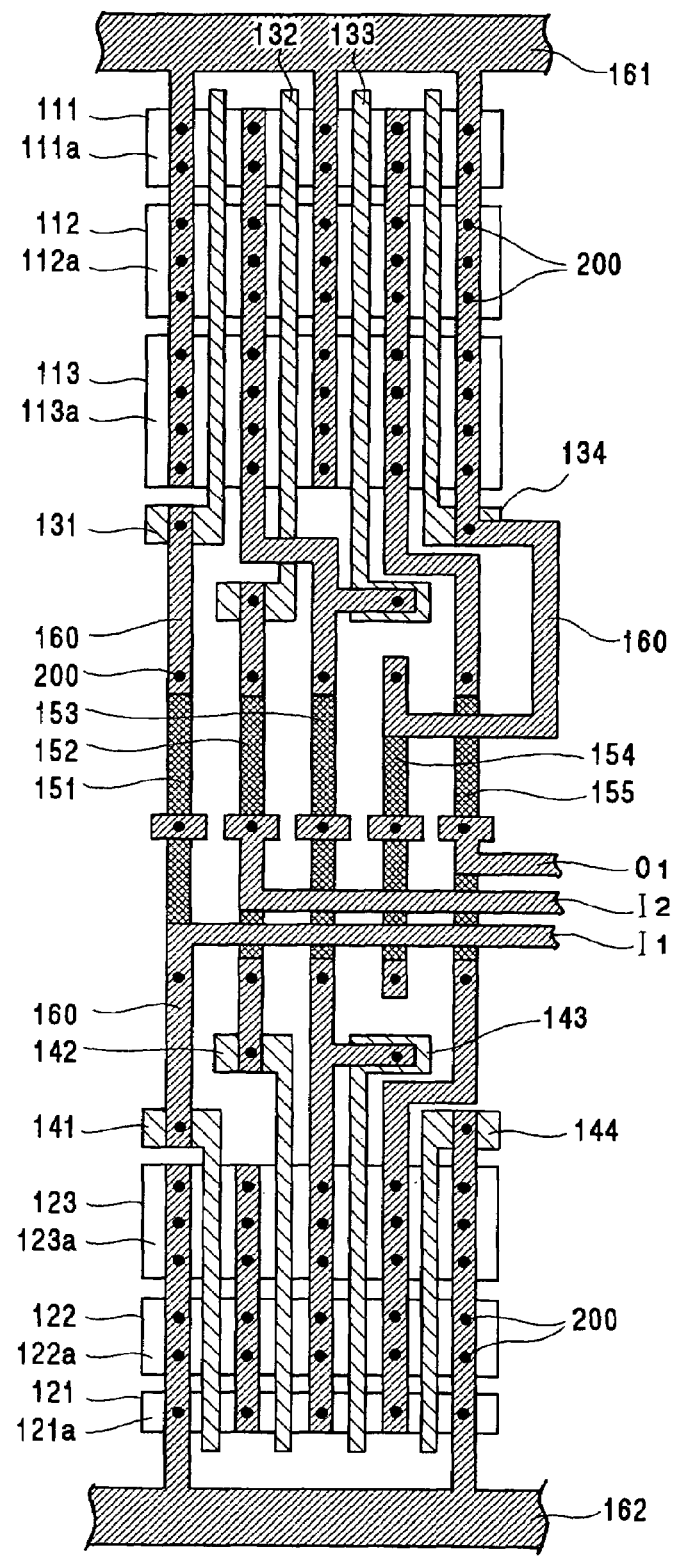
FIG. 10 is a schematic plan view showing the pattern of the main wire layer in the case where an AND circuit of 2-input type is formed in the spare cell region.
Figure 11A:
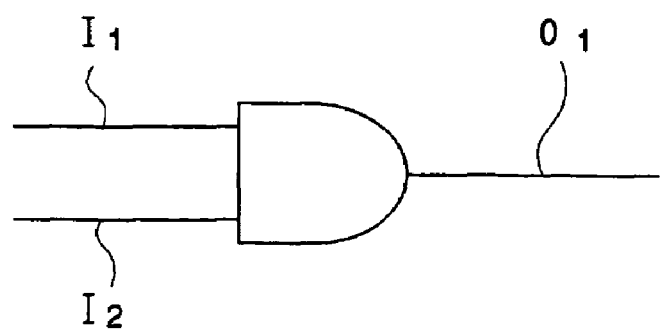
FIG. 11A is a symbol diagram of the AND circuit of 2-input type.
Figure 11B:
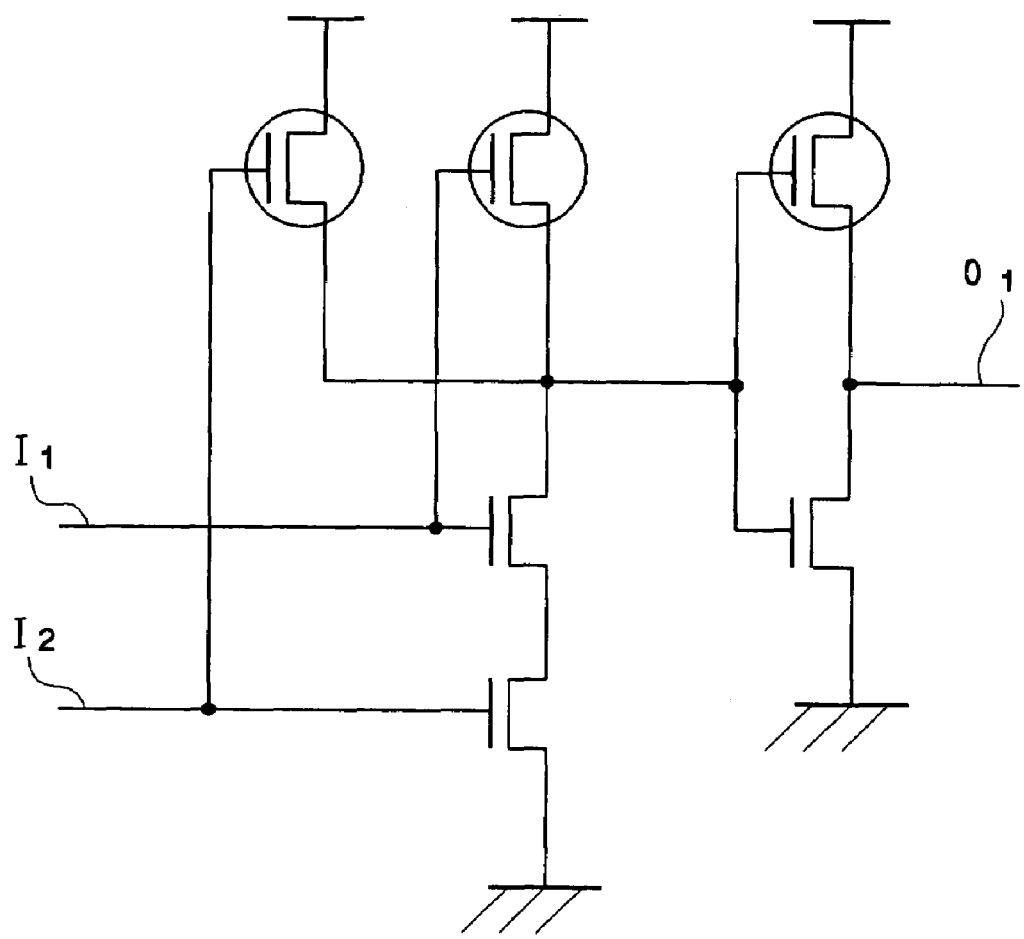
FIG. 11B is a circuit diagram of the AND circuit of 2-input type.

FIG. 10 is a schematic plan view showing the pattern of the main wire layer in the case where an AND circuit of 2-input type is formed in the spare cell region. A symbol diagram and a circuit diagram of the AND circuit of 2-input type are shown in FIG. 11A and FIG. 11B, respectively. In this example, using four bypass wires 151 to 153 and 155, the AND circuit is implemented by connecting an inverter circuit subsequent to the NAND circuit shown in FIG. 8.

Figure 12:
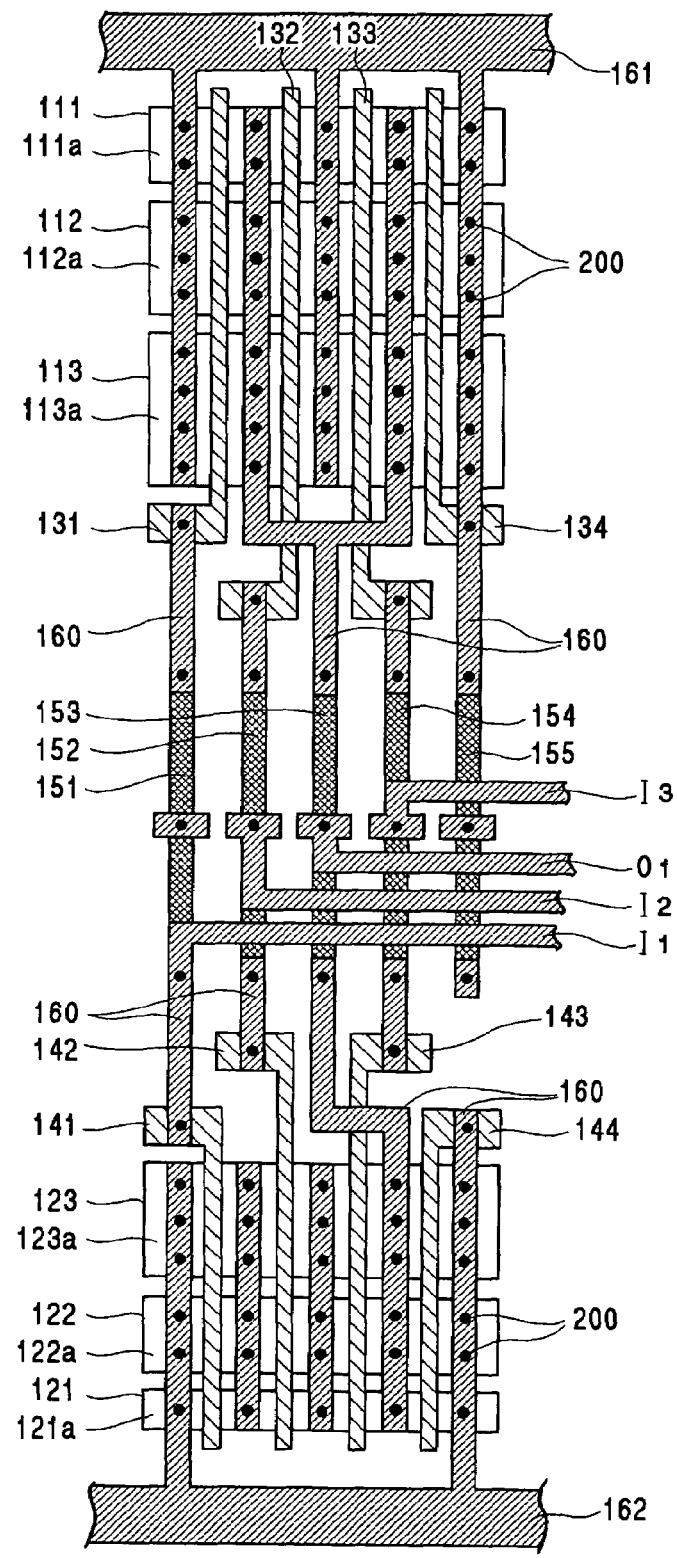
FIG. 12 is a schematic plan view showing the pattern of the main wire layer in the case where a NAND circuit of 3-input type is formed in the spare cell region.
Figure 13A:
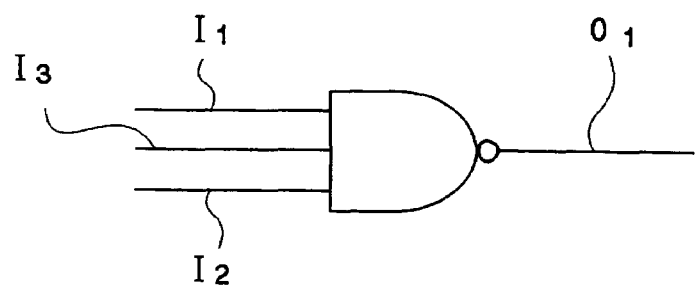
FIG. 13A is a symbol diagram of the NAND circuit of 3-input type.
Figure 13B:
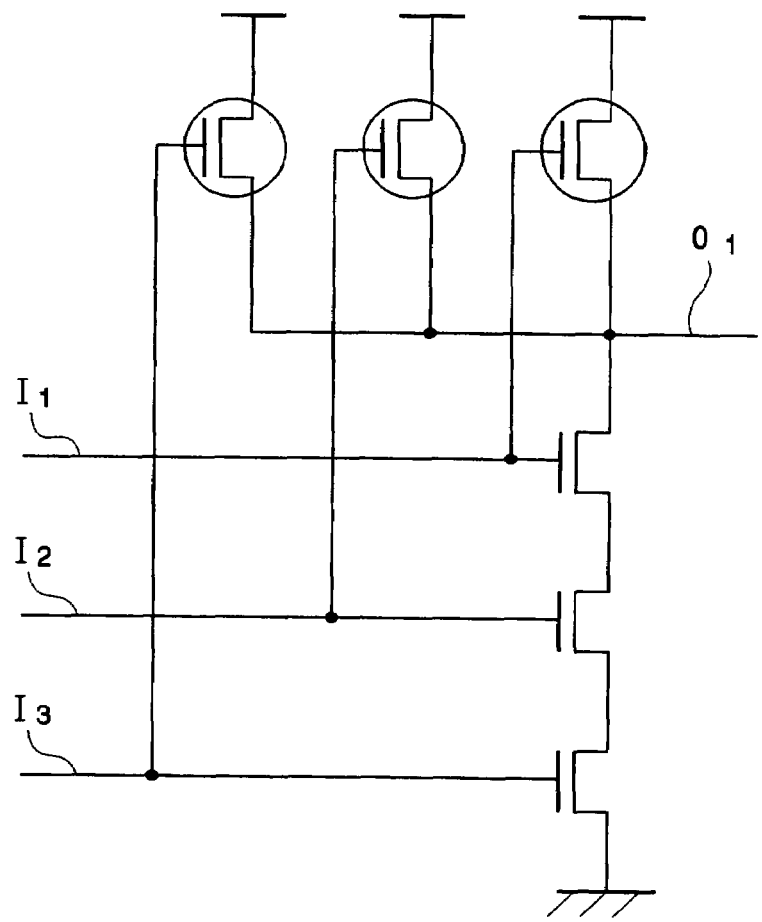
FIG. 13B is a circuit diagram of the NAND circuit of 3-input type.

FIG. 12 is a schematic plan view showing the pattern of the main wire layer in the case where a NAND circuit of 3-input type is formed in the spare cell region. A symbol diagram and a circuit diagram of the NAND circuit of 3-input type are shown in FIG. 13A and FIG. 13B, respectively. In this example, using four bypass wires 151 to 154, the NAND circuit is implemented using the main wires 160 to connect three P-channel MOS transistors in parallel located at an extension of the bypass wires 151 to 154 in Y direction and to connect three N-channel MOS transistors in serial located at the opposite extension. As shown in FIG. 12, four main wires 160 (first input signal line $I_1$, second input signal line $I_1$) third input signal line $I_3$ and output signal line $O_1$) intersect above the bypass wires 154 and 155.

Figure 14:
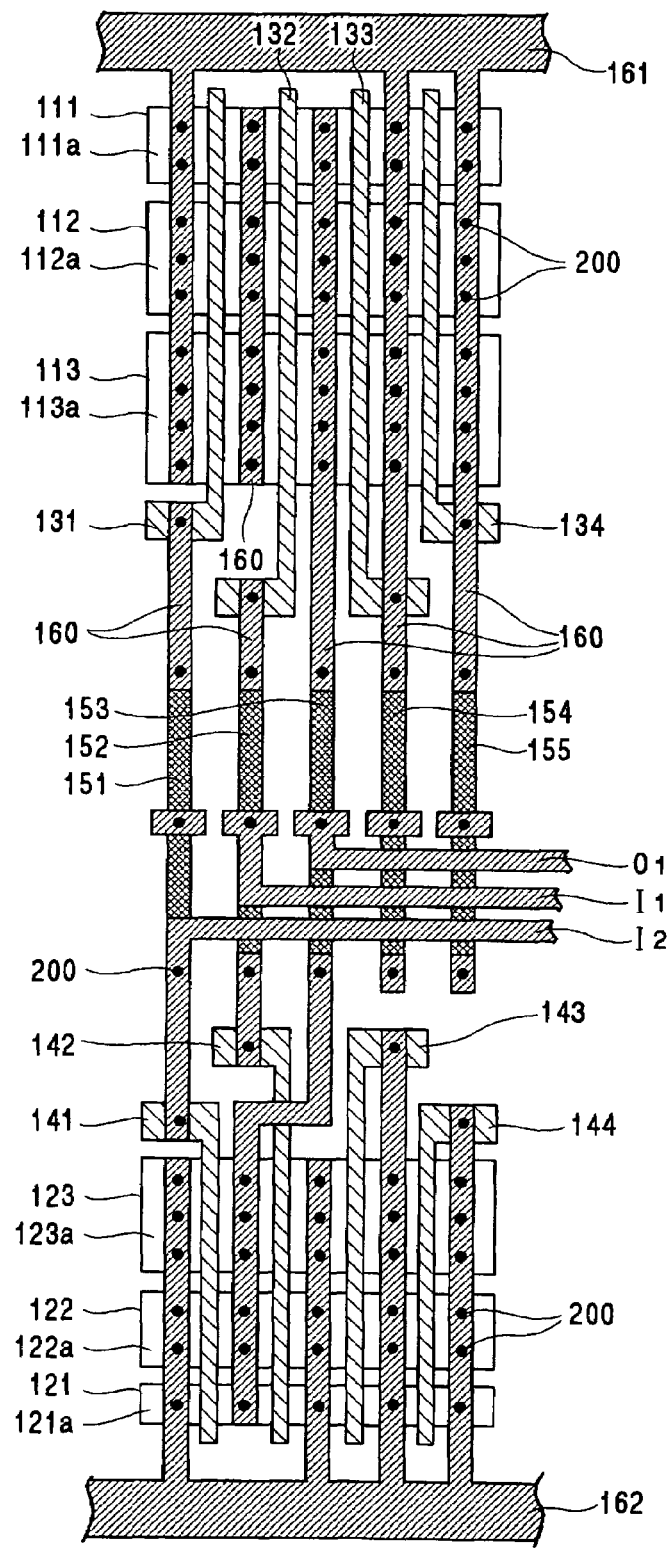
FIG. 14 is a schematic plan view showing the pattern of the main wire layer in the case where a NOR circuit of 2-input type is formed in the spare cell region.
Figure 15A:
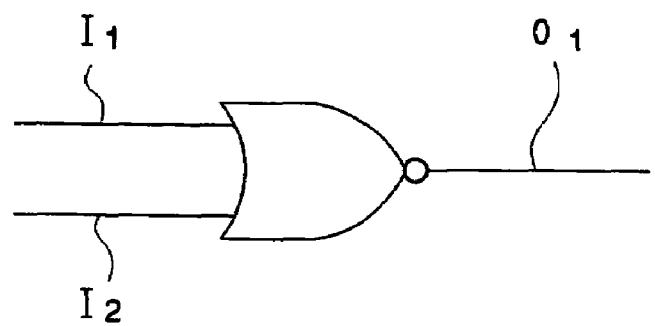
FIG. 15A is a symbol diagram of the NOR circuit of 2-input type.
Figure 15B:
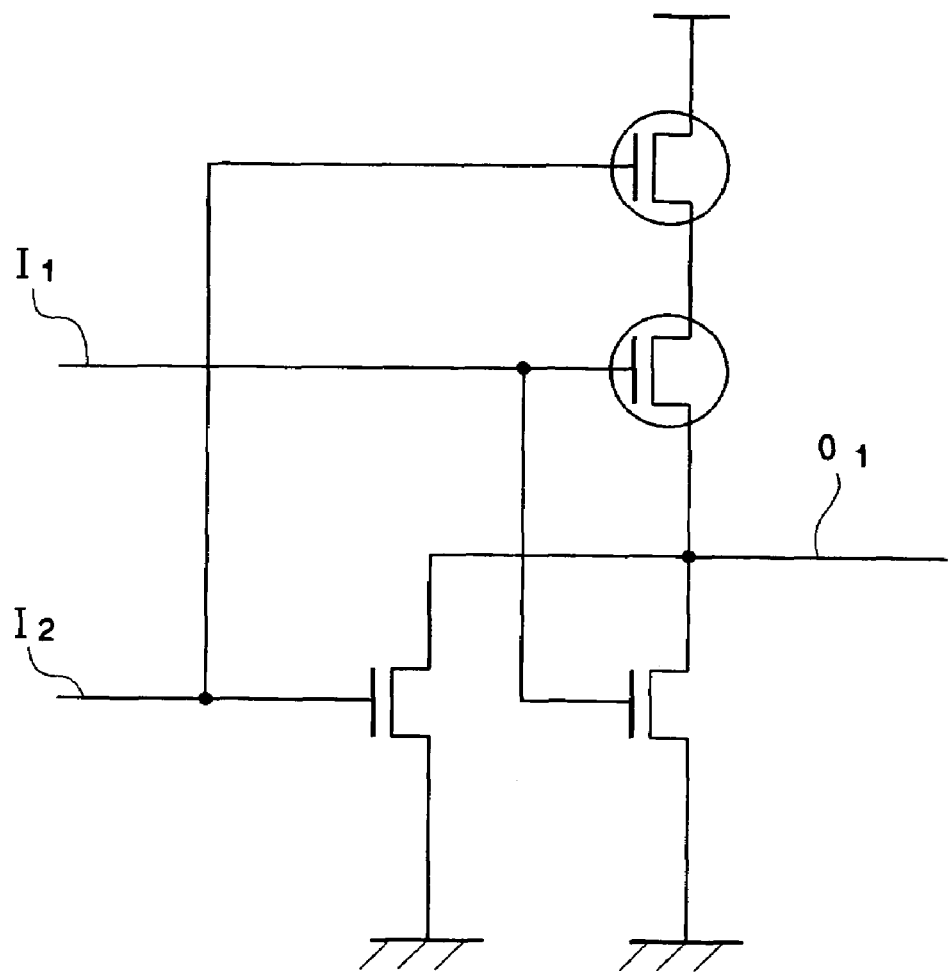
FIG. 15B is a circuit diagram of the NOR circuit of 2-input type.

FIG. 14 is a schematic plan view showing the pattern of the main wire layer in the case where a NOR circuit of 2-input type is formed in the spare cell region. A symbol diagram and a circuit diagram of the NOR circuit of 2-input type are shown in FIG. 15A and FIG. 15B, respectively. In this example, using three bypass wires 151 to 153, the NOR circuit is implemented using the main wires 160 to connect two P-channel MOS transistors in serial located at an extension of the bypass wires 151 to 153 in Y direction and to connect two N-channel MOS transistors in parallel located at the opposite extension. As shown in FIG. 14, three main wires 160 (first input signal line $I_1$, second input signal line $I_2$ and output signal line $O_1$) intersect above the bypass wires 153 to 155.

Figure 16:
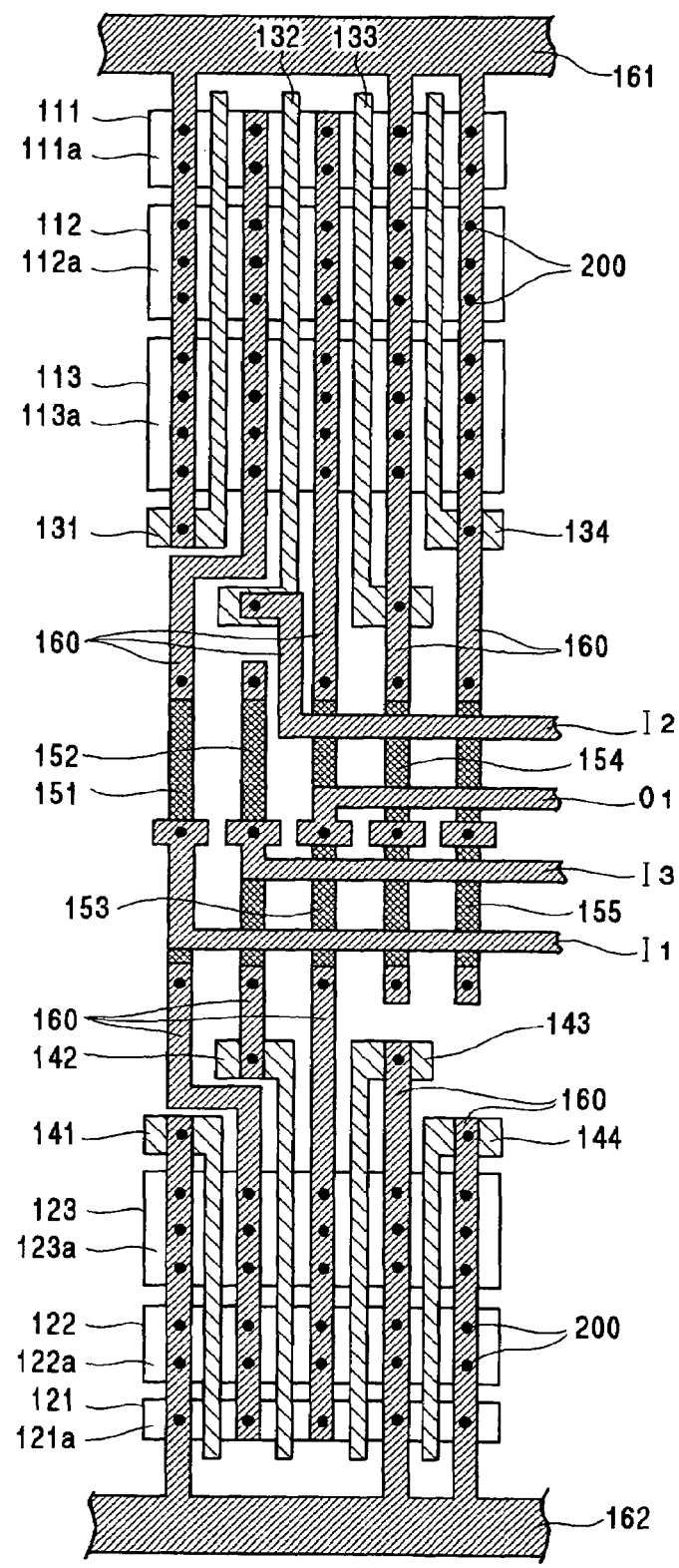
FIG. 16 is a schematic plan view showing the pattern of the main wire layer in the case where a transfer circuit is formed in the spare cell region.
Figure 17:
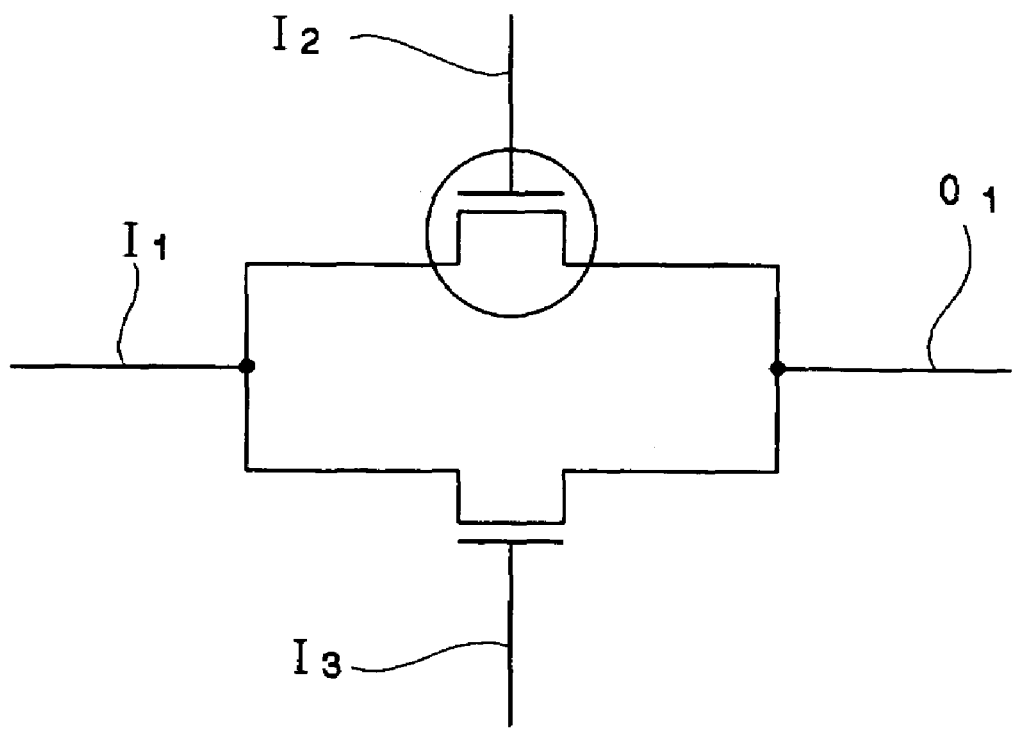
FIG. 17 is a circuit diagram of the transfer circuit.

FIG. 16 is a schematic plan view showing the pattern of the main wire layer in the case where a transfer circuit is formed in the spare cell region. A circuit diagram of the transfer circuit is shown in FIG. 17. In this example, the transfer circuit is implemented using the main wires 160 for connecting a transfer input signal line $I_1$ to one terminal of a switch (one of the source/drain regions), connecting a transfer output signal line $O_1$ to the other terminal of the switch (the other of the source/drain regions), connecting a first control signal line $I_2$ to the gate electrode 132 for P-channel transistors, and connecting a second control signal line $I_3$ to the gate electrode 142 for N-channel transistors. As shown in FIG. 16, four main wires 160 (transfer input signal line $I_1$, first control signal line $I_2$, second control signal line $I_3$ and transfer output signal line $O_1$) intersect above the bypass wires 153 to 155.

Figure 18:
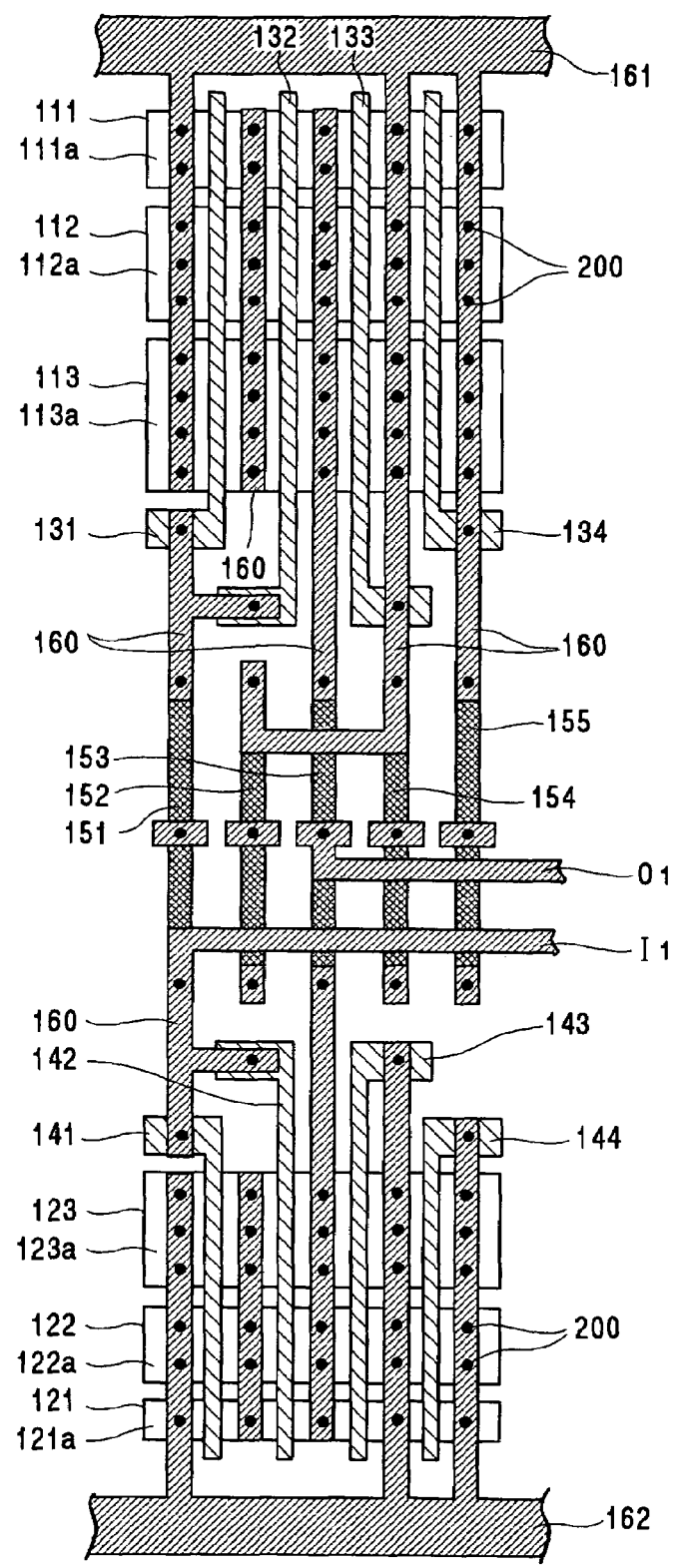
FIG. 18 is a schematic plan view showing the pattern of the main wire layer in the case where a delay circuit is formed in the spare cell region.
Figure 19:
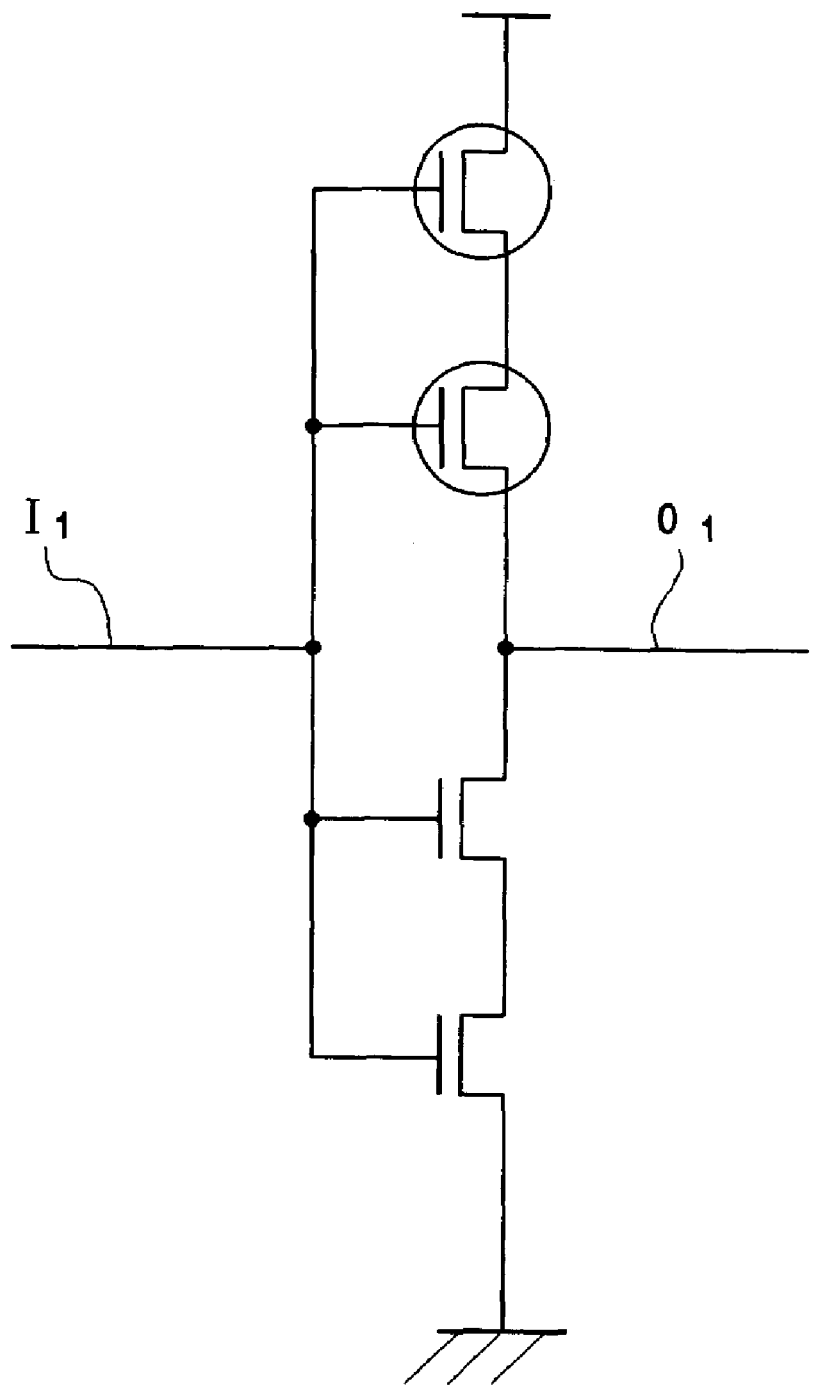
FIG. 19 is a circuit diagram of the delay circuit.

FIG. 18 is a schematic plan view showing the pattern of the main wire layer in the case where a delay circuit is formed in the spare cell region. A circuit diagram of the delay circuit is shown in FIG. 19. The delay circuit of this example is configured by substituting a serial circuit of two transistors for each of the P-channel MOS transistor and N-channel MOS transistor constituting the inverter circuit. In this example, each transistor has relatively large driving capability because the P-channel transistor regions 111 to 113 are used in parallel and N-channel transistor regions 121 to 123 are used in parallel. However, when more delay time is required, the driving capability of the transistors can be decreased by using only a part of the P-channel transistor regions 111 to 113 and a part of the N-channel transistor regions 121 to 123. The delay time can be increased by increasing the number of transistors constituting said serial circuits.

Figure 20:
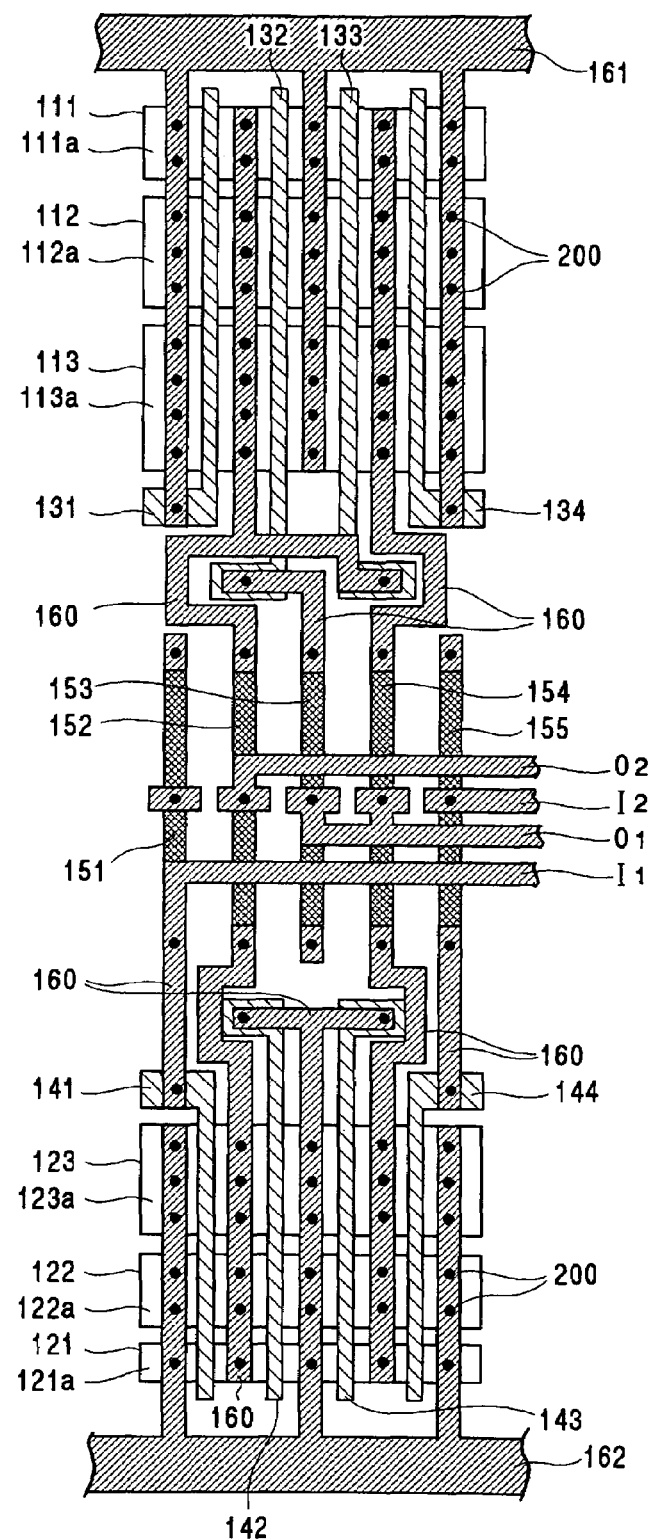
FIG. 20 is a schematic plan view showing the pattern of the main wire layer in the case where a comparator circuit is formed in the spare cell region.
Figure 21:
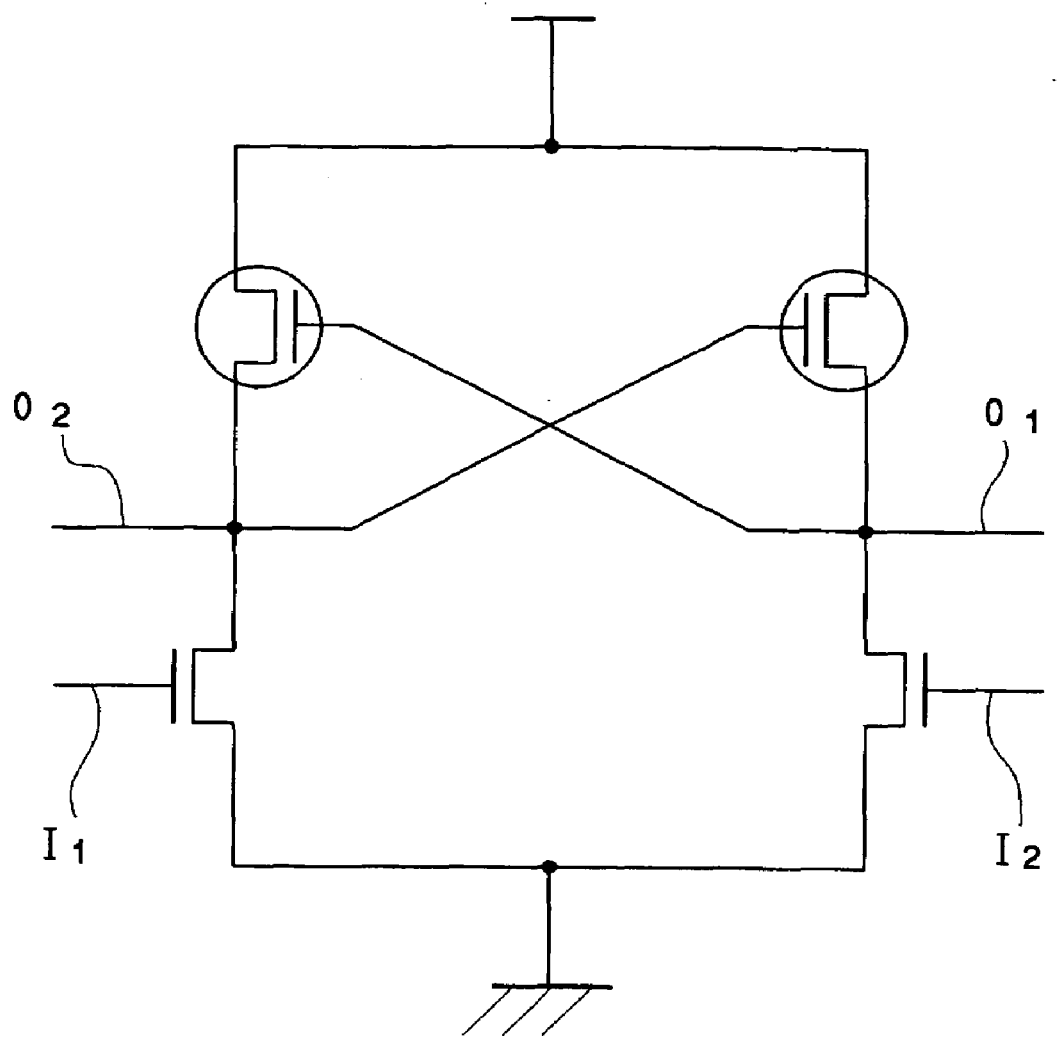
FIG. 21 is a circuit diagram of the comparator circuit.

FIG. 20 is a schematic plan view showing the pattern of the main wire layer in the case where a comparator circuit is formed in the spare cell region. A circuit diagram of the comparator circuit is shown in FIG. 21. In this example, five bypass wires 151 to 155 are used, and four main wires 160 (first input signal line $I_1$, second input signal line $I_2$, first output signal line $O_1$ and second output signal line $O_2$) intersect above the bypass wires 153 to 155. As shown in FIG. 21, although the comparator circuit requires crossed wires, such crossed wires can be realized by using the bypass wires.

Figure 22:
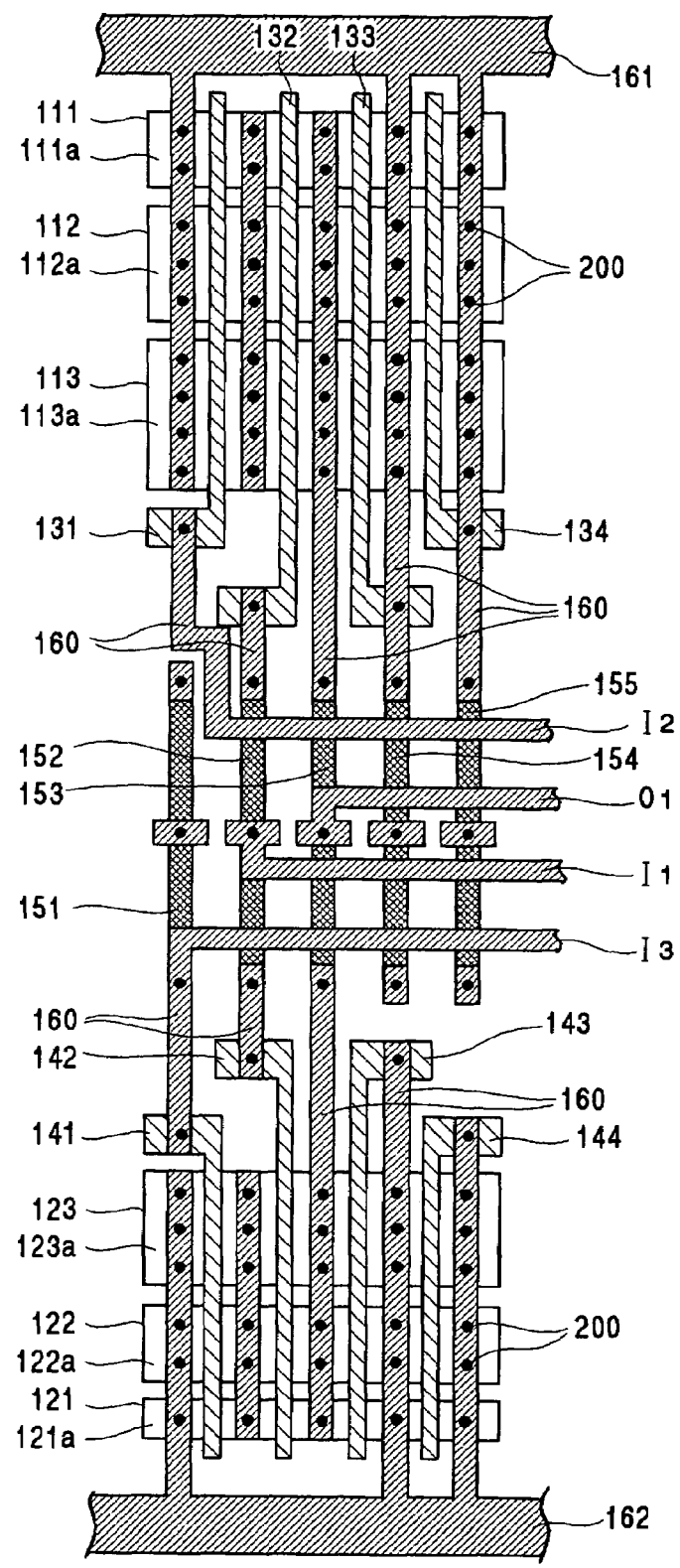
FIG. 22 is a schematic plan view showing the pattern of the main wire layer in the case where a clocked inverter circuit is formed in the spare cell region.
Figure 23:
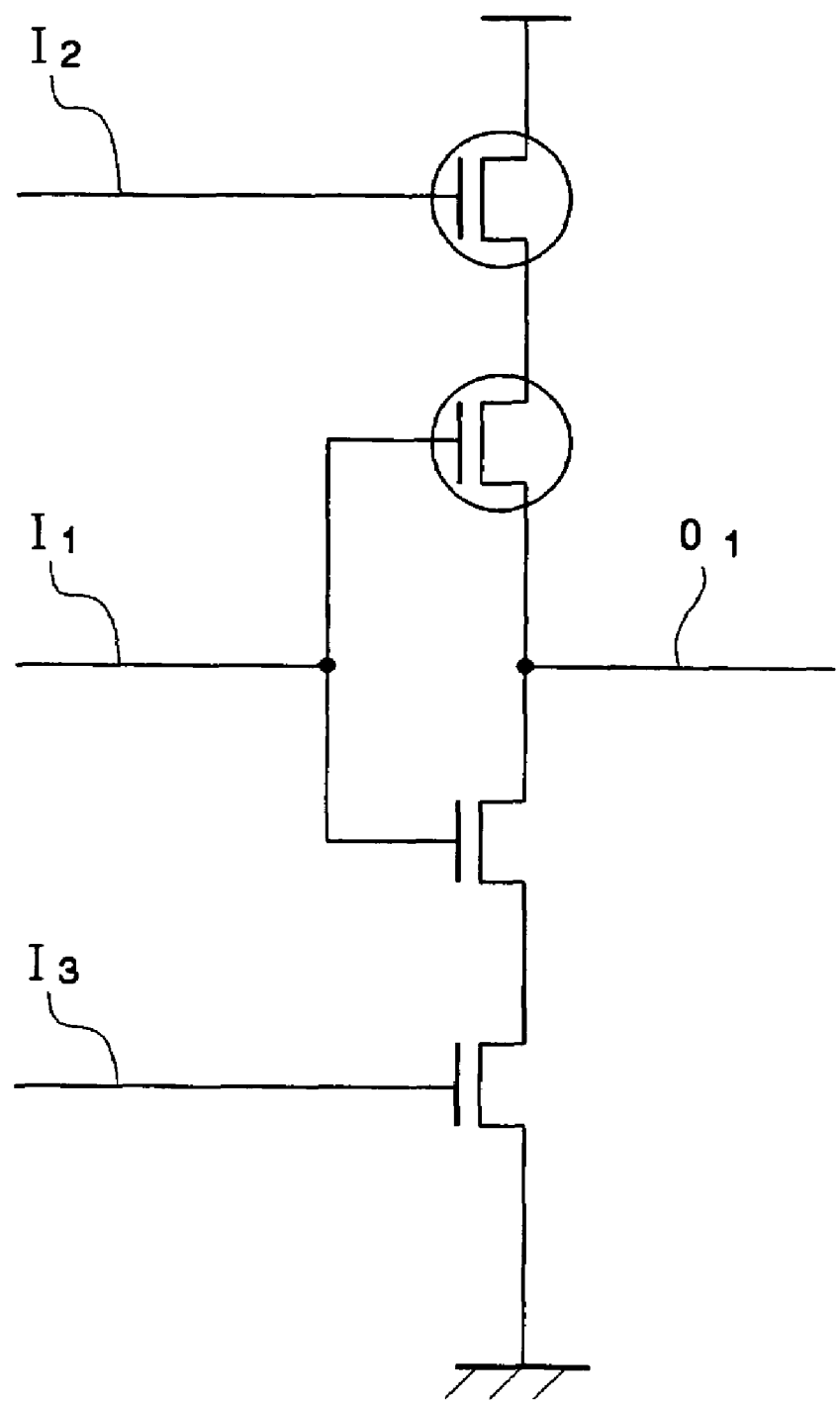
FIG. 23 is a circuit diagram of the clocked inverter circuit.

FIG. 22 is a schematic plan view showing the pattern of the main wire layer in the case where a clocked inverter circuit is formed in the spare cell region. A circuit diagram of the clocked inverter circuit is shown in FIG. 23. The clocked inverter circuit has a configuration wherein another P-channel MOS transistor is inserted between a source of the P-channel MOS transistor of the inverter circuit and the power supply line 161 and another N-channel MOS transistor is inserted between a source of the N-channel MOS transistor of the inverter circuit and the ground line 162. As shown in FIG. 22, four main wires 160 (input signal line $I_1$, first clock signal line $I_2$, second clock signal line $I_3$ and output signal line $O_1$) intersect above the bypass wires 153 to 155.

Figure 24:
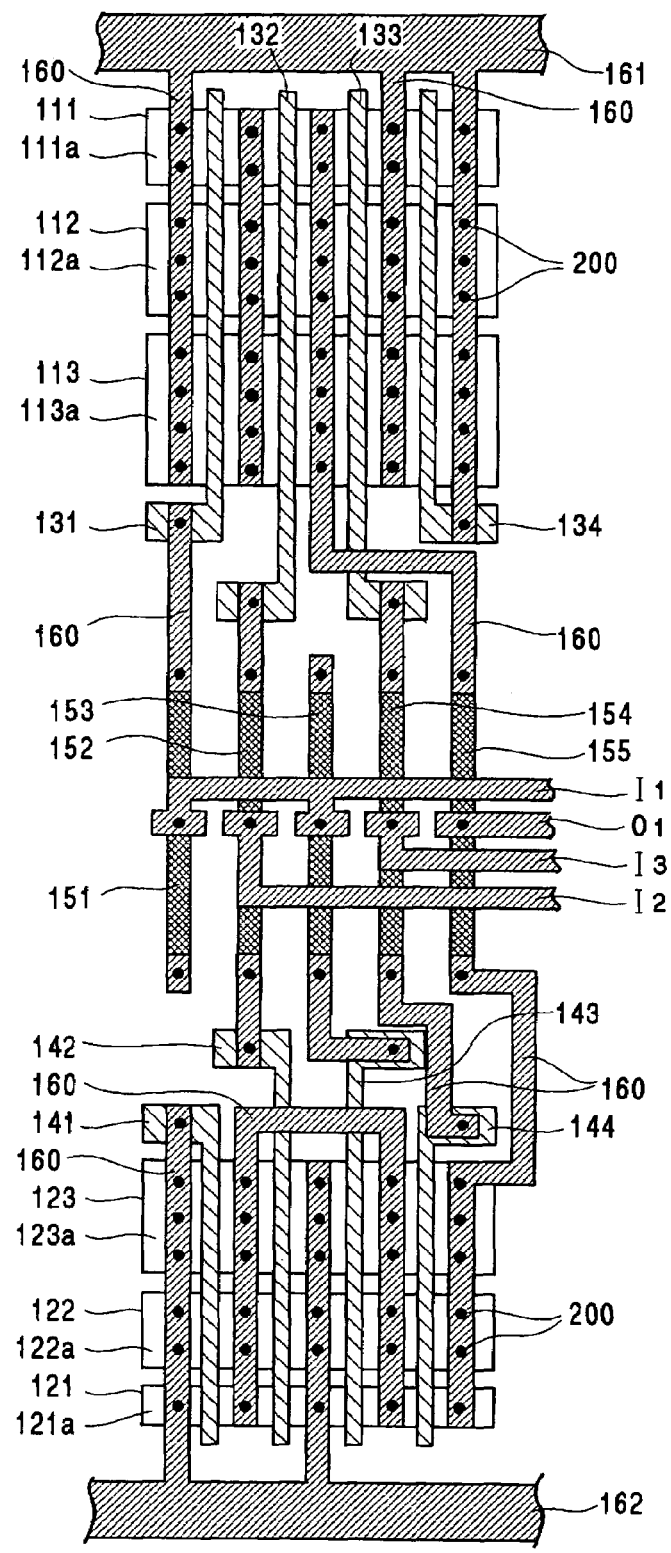
FIG. 24 is a schematic plan view showing the pattern of the main wire layer in the case where a complex gate circuit is formed in the spare cell region.
Figure 25A:
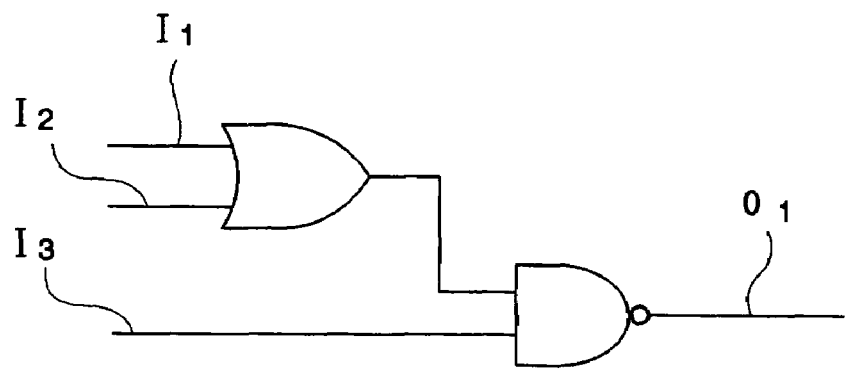
FIG. 25 is a circuit diagram of the complex gate circuit shown in FIG. 24.
Figure 25B:
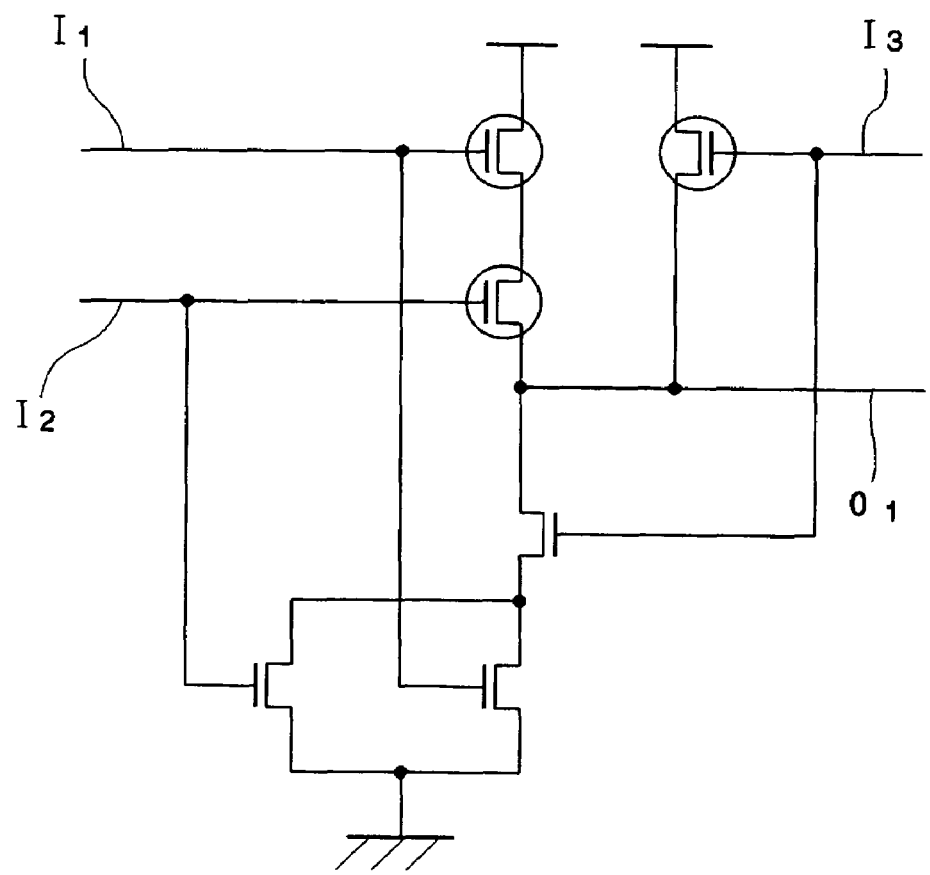

FIG. 24 is a schematic plan view showing the pattern of the main wire layer in the case where a complex gate circuit is formed in the spare cell region. A circuit diagram of this complex gate circuit is shown in FIG. 25. This complex gate circuit is a 3-input type circuit that is a combination of an OR circuit and a NAND circuit. As shown in FIG. 24, four main wires 160 (first input signal line $I_1$, second input signal line $I_2$, third input signal line $I_3$ and output signal line $O_1$) intersect above the bypass wires 154 and 155. Such a complex circuit can be configured by only changing the pattern of the main wire layer.

Figure 26:
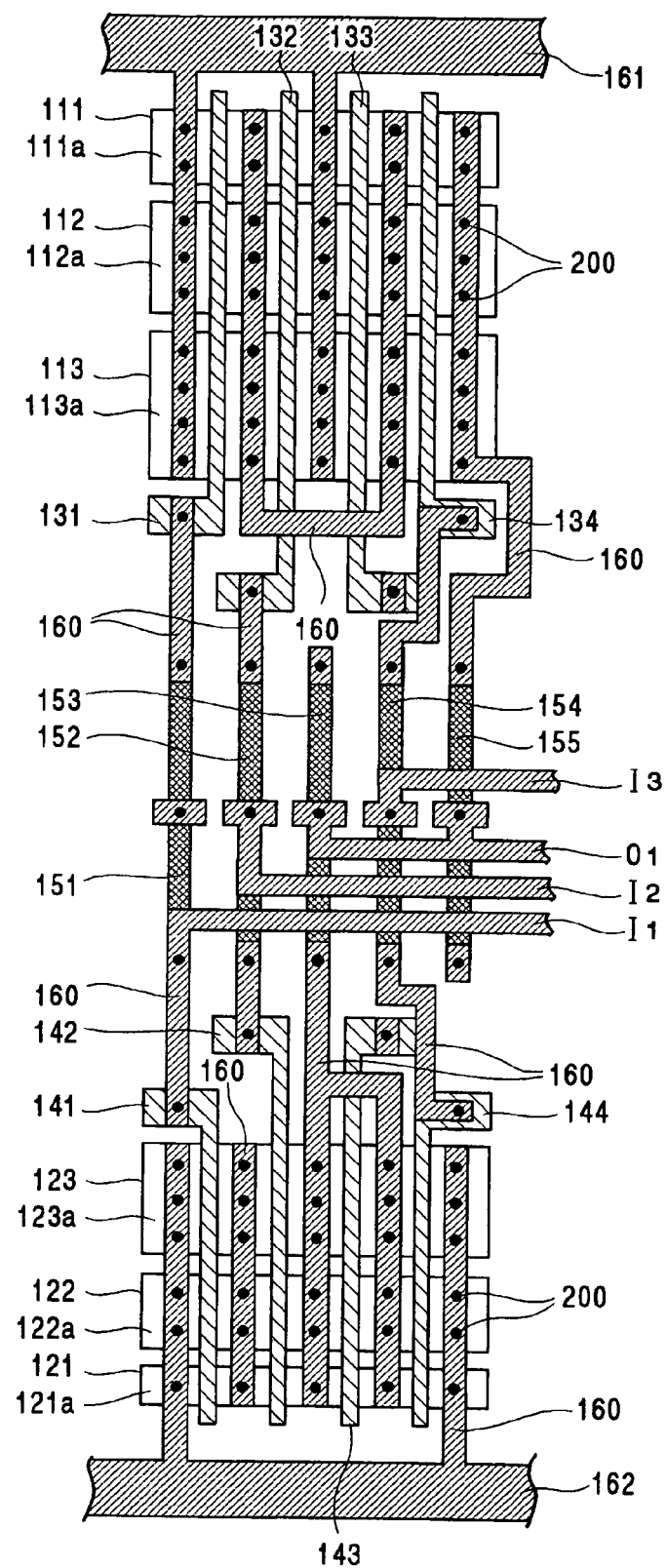
FIG. 26 is a schematic plan view showing the pattern of the main wire layer in the case where another complex gate circuit is formed in the spare cell region.
Figure 27A:
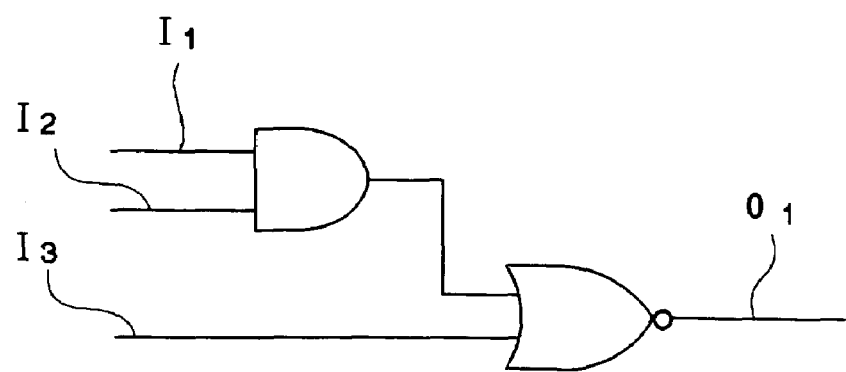
FIG. 27 is a circuit diagram of the complex gate circuit shown in FIG. 26.
Figure 27B:
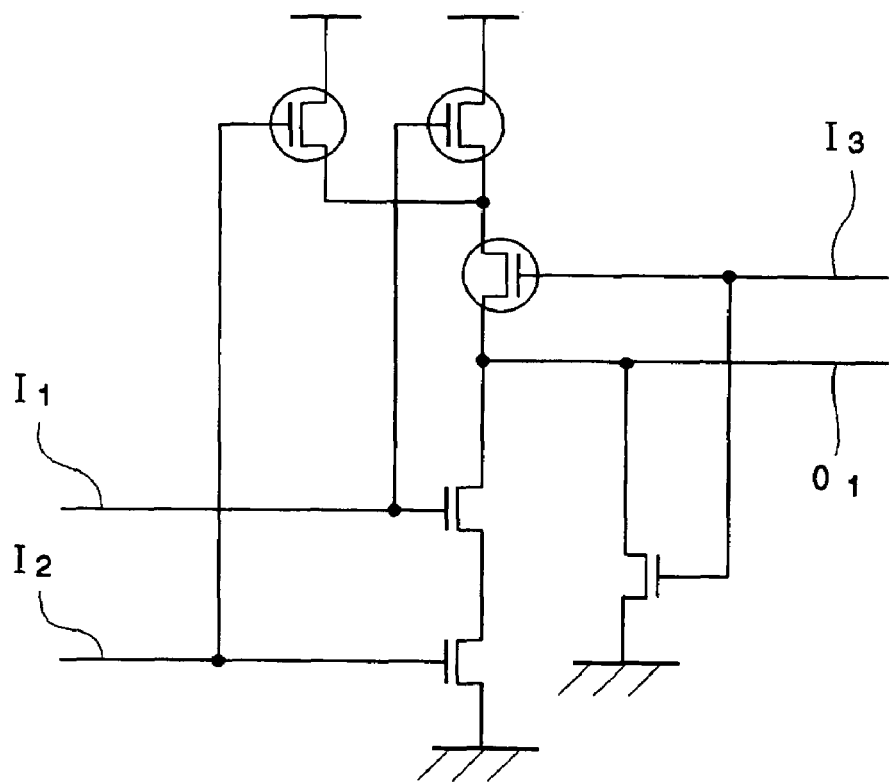

FIG. 26 is a schematic plan view showing the pattern of the main wire layer in the case where another complex gate circuit is formed in the spare cell region. A circuit diagram of this complex gate circuit is shown in FIG. 27. This complex gate circuit is a 3-input type circuit that is a combination of an AND circuit and a NOR circuit. As shown in FIG. 26, four main wires 160 (first input signal line $I_1$, second input signal line $I_2$, third input signal line $I_3$ and output signal line $O_1$) intersect above the bypass wires 154 and 155. Such a complex circuit can be configured by only changing the pattern of the main wire layer.

Figure 28:
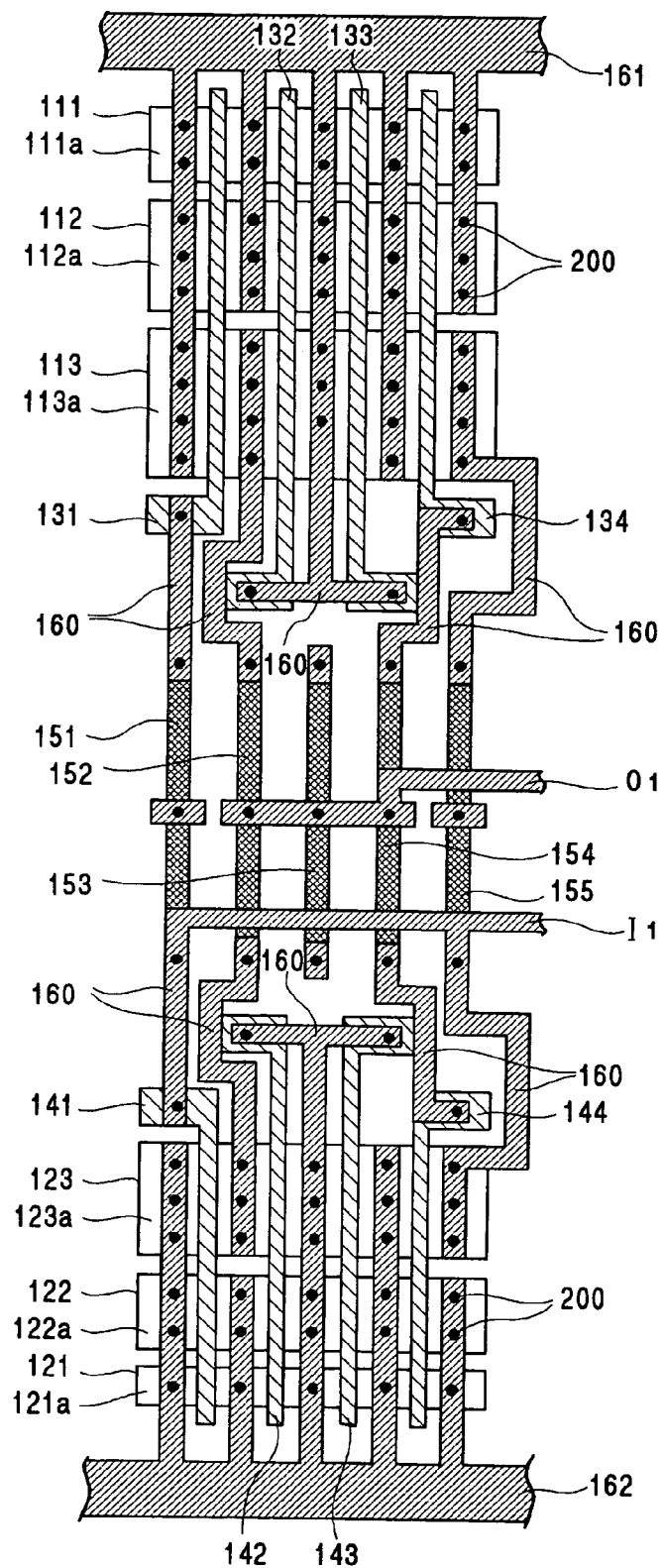
FIG. 28 is a schematic plan view showing the pattern of the main wire layer in the case where a latch circuit is formed in the spare cell region.
Figure 29A:
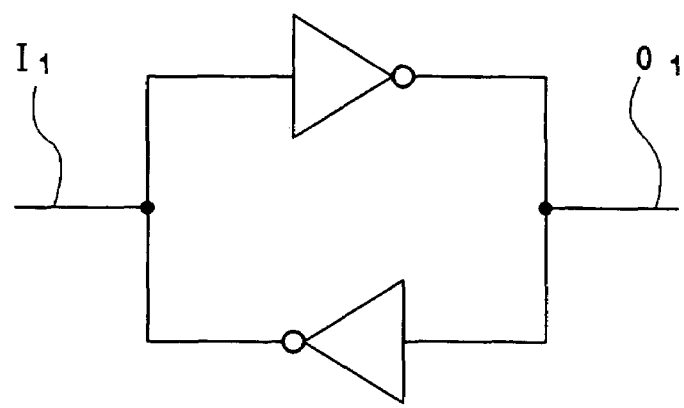
FIG. 29A is a symbol diagram of the latch circuit.
Figure 29B:
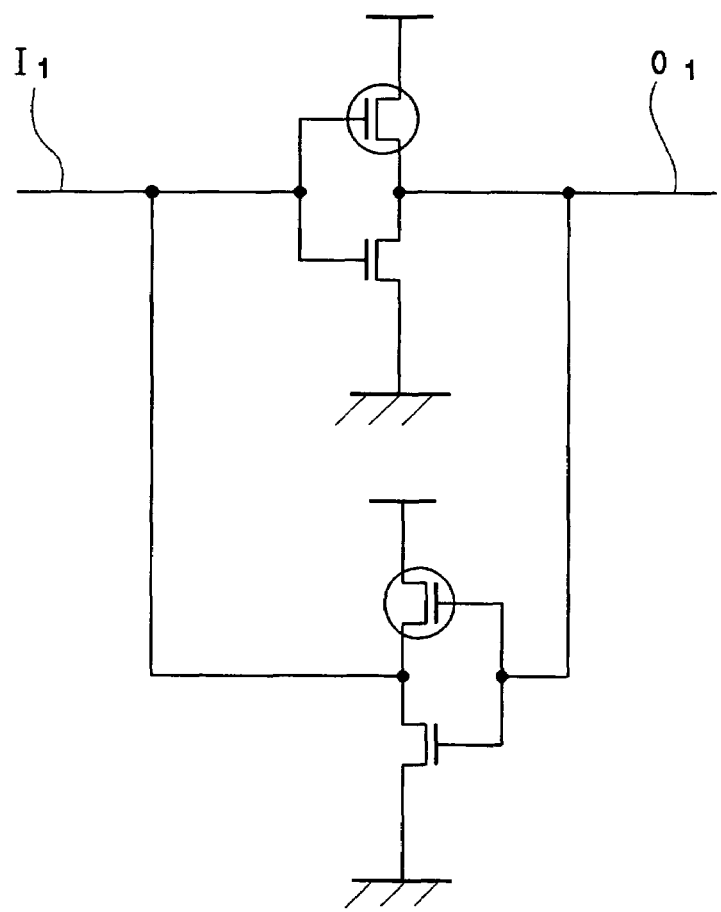
FIG. 29B is a circuit diagram of the latch circuit.

FIG. 28 is a schematic plan view showing the pattern of the main wire layer in the case where a latch circuit is formed in the spare cell region. A symbol diagram and a circuit diagram of the latch circuit are shown in FIG. 29A and FIG. 29B, respectively. This latch circuit has a configuration wherein two inverter circuits are connected cyclically. According to this embodiment, such a sequential circuit can be configured by only changing the pattern of the main wire layer.

The present invention is in no way limited to the aforementioned embodiments, but rather various modifications are possible within the scope of the invention as recited in the claims, and naturally these modifications are included within the scope of the invention.

For example, in the above described embodiments, the bypass wires are formed using wires of the bypass wire layer that is a layer located above the gate wire layer. However, the bypass wires can be formed using wires of another layer insofar as it is a different layer from main wire layer. Therefore, the bypass wires can be formed using wires of the gate wire layer. It is worth noting that the bypass wires are preferably formed using wire layers different from the gate wire layer that are made of tungsten (W) or the like taking the wire resistance into account because the gate wire layer is ordinarily made of polycrystalline silicon. Further, the bypass wire layer can be located above the main wire layer. However, it is extremely preferable that the main wire layer is located at upper of the bypass wire layer as the above described embodiments taking into account the effect that change of the lower layer has on the upper layer processes.

Further, in the above described embodiments, four gate electrodes are provided with respect to each P-channel transistor region 111 to 113 and N-channel transistor region 121 to 123. However, the number of the gate electrodes can be changed according to the size of the spare cell region and so on. Although the plurality of bypass wires are located in parallel with the gate electrodes with almost the same pitch as the gate electrodes, the number of the bypass wires can also be changed according to the size of the spare cell region and so on. While it is not absolutely necessary to locate the bypass wires and the gate electrodes in parallel, usability of the spare cell region can be maximized by locating the bypass wires and the gate electrodes in parallel and substantially matching their pitch. When it is desired to form a more complex wiring pattern, however, the pitch between some of the gate electrodes should be expanded so as to enable passage of a plurality of the wires through the area.

Figure 30:
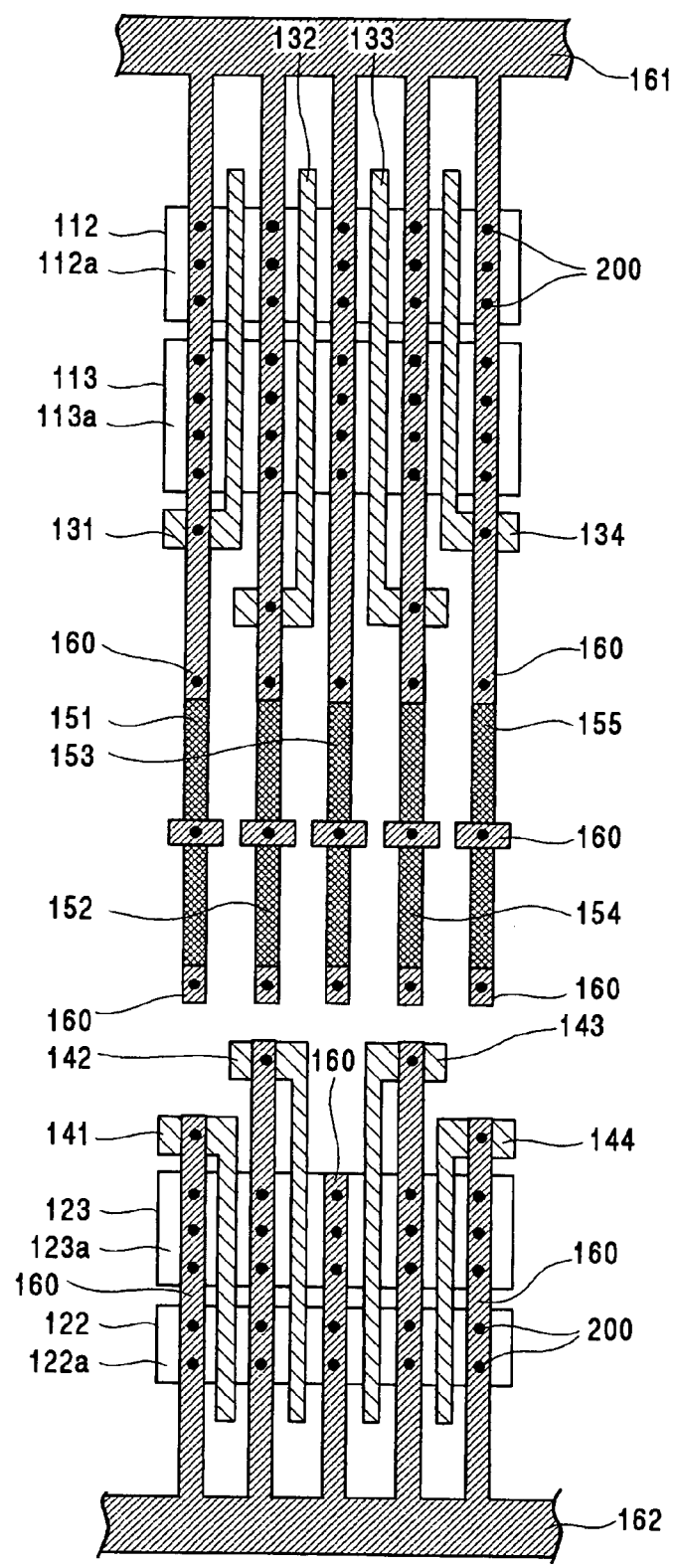
FIG. 30 is a plan view showing the structure of a spare cell region having two P-channel transistor regions whose channel widths are different from each other and two N-channel transistor regions whose channel widths are different from each other.

Furthermore, in the above described embodiments, although three P-channel transistor regions and three N-channel transistor regions are provided, there is no particular limit on the number of transistor regions. Therefore, as shown in FIG. 30, the spare cell region can be constituted of two P-channel transistor regions 112 and 113 and two N-channel transistor regions 122 and 123.

Figure 31:
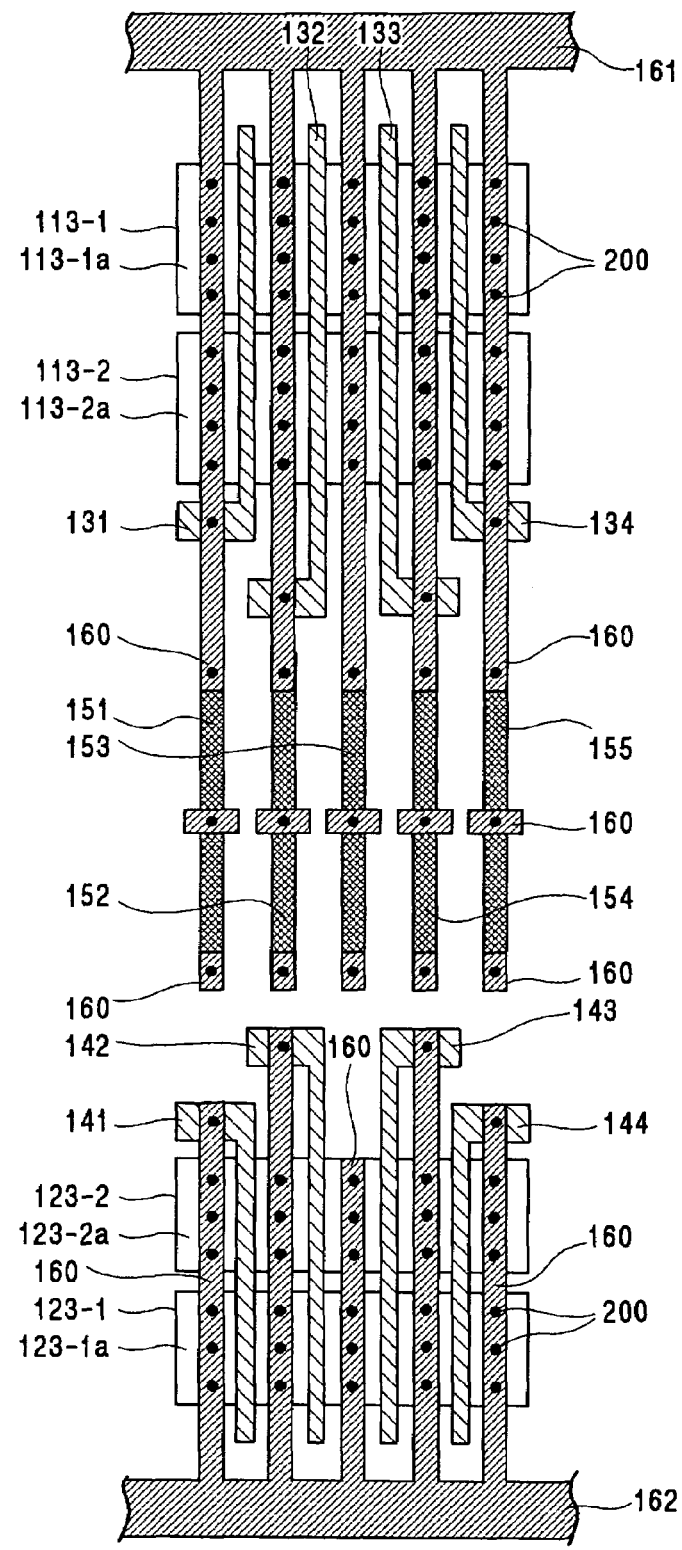
FIG. 31 is a plan view showing the structure of a spare cell region having two P-channel transistor regions whose channel widths are the same as each other and two N-channel transistor regions whose channel widths are the same as each other.

Further, in the above described embodiments, although these three transistor regions have different channel widths from one another, the present invention is not limited to this arrangement. Therefore, as shown in FIG. 31, the spare cell region can be constituted of two P-channel transistor regions 113-1 and 113-2 whose channel widths are the same and two N-channel transistor regions 123-1 and 123-2 whose channel widths are the same. However, in the case where a plurality of transistor regions are provided, the driving capability of the logic circuit can be finely controlled by setting these channel widths different from one another. In the above described embodiments, although the channel widths of the P-channel transistor regions 111 to 113 are greater than that of the N-channel transistor regions 121 to 123, respectively, the present invention is not limited to this arrangement.

Figure 32:
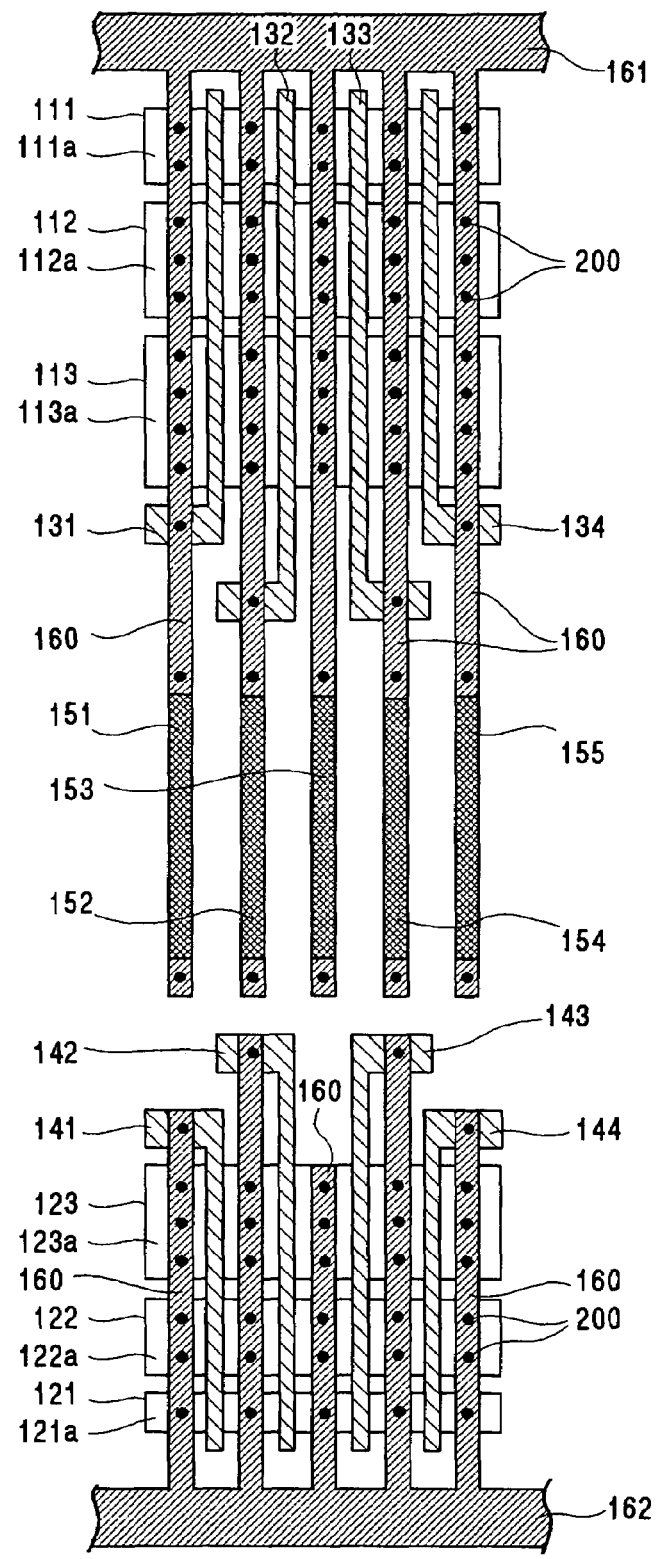
FIG. 32 is a plan view showing the structure of a spare cell region having bypass wires each of which is connected to the main wires at two points.
Figure 33:
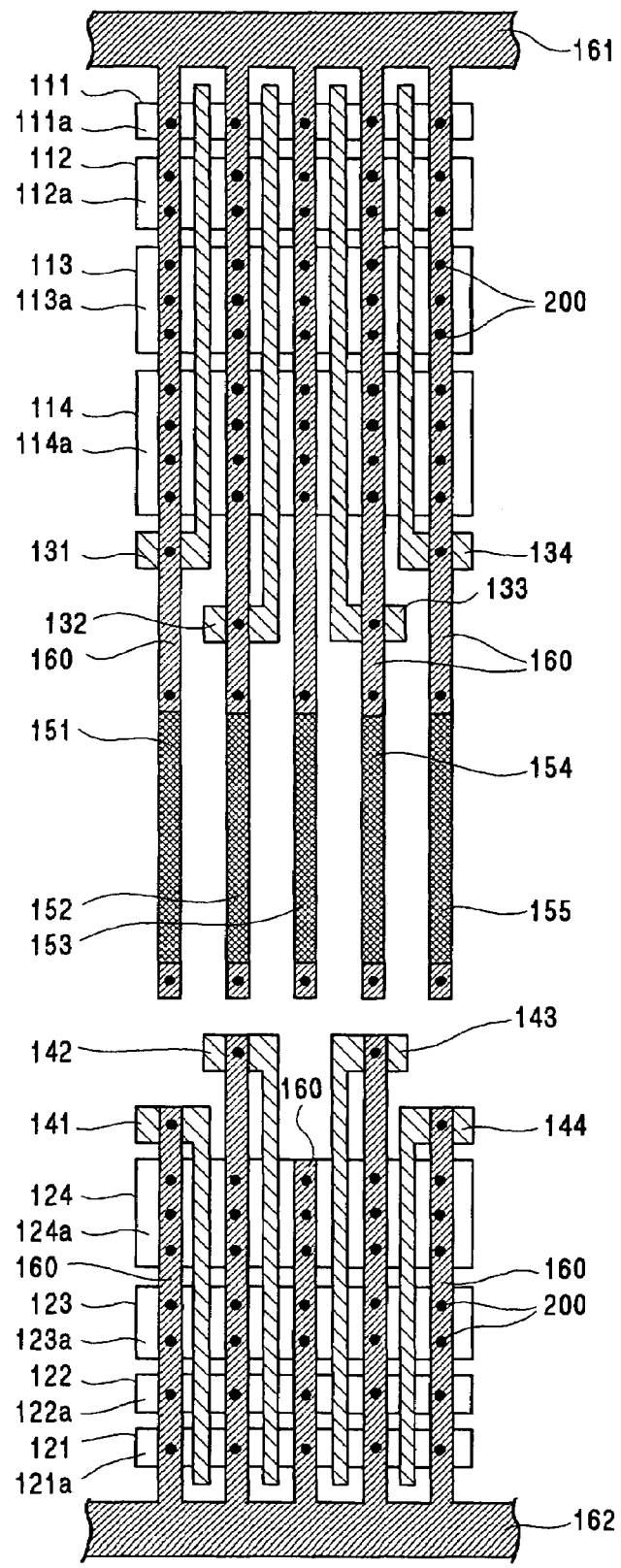
FIG. 33 is a plan view showing the structure of a spare cell region having four P-channel transistor regions whose channel widths are different from each other and four N-channel transistor regions whose channel widths are different from each other.

Furthermore, in the above described embodiments, although each bypass wire is connected to the main wires at three points, the present invention is not limited to this arrangement. It is enough that the bypass wires are connected to the main wires at more than one point as already explained. FIG. 32 is a plan view showing the structure of the spare cell region having bypass wires each of which is connected to the main wire at two points. FIG. 33 is a plan view showing the structure of the spare cell region having four P-channel transistor regions 111 to 114 whose channel widths are different from each other and four N-channel transistor regions 121 to 124 whose channel widths are different from each other. As shown in FIG. 33, in this example each bypass wire 151 to 155 is connected to the main wires at two points.

Figure 34:
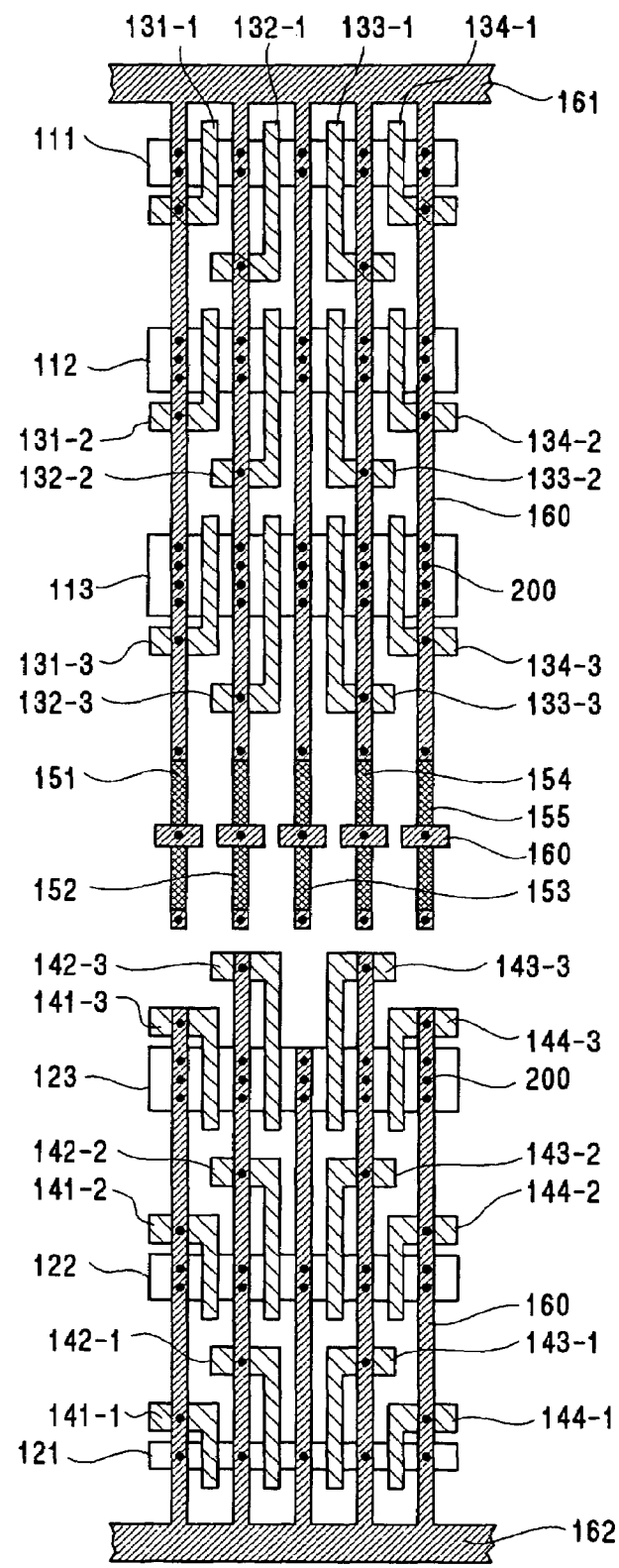
FIG. 34 is a plan view showing the structure of a spare cell region having gate electrodes each of which is assigned to a single transistor region.
Figure 35:
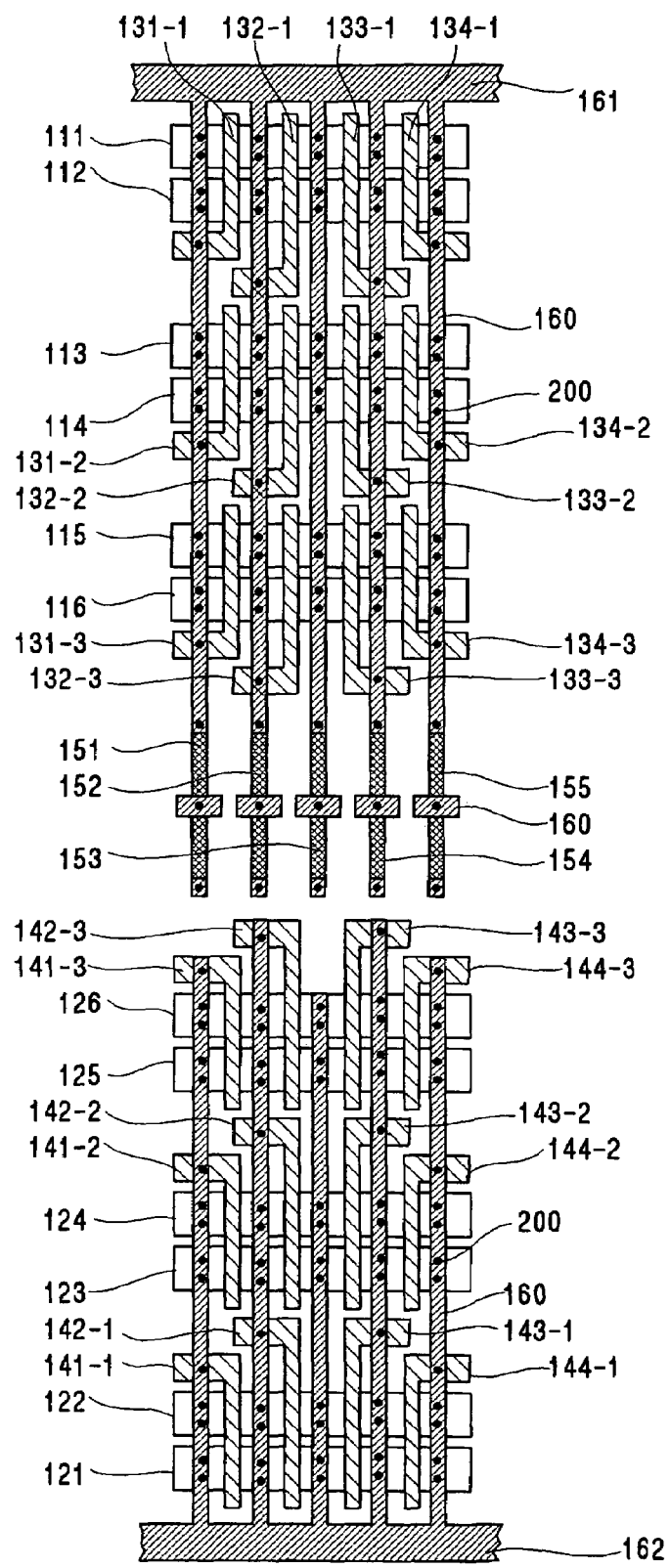
FIG. 35 is a plan view showing the structure of a spare cell region having gate electrodes which are assigned to some transistor regions among a plurality of transistor regions.
Figure 36:
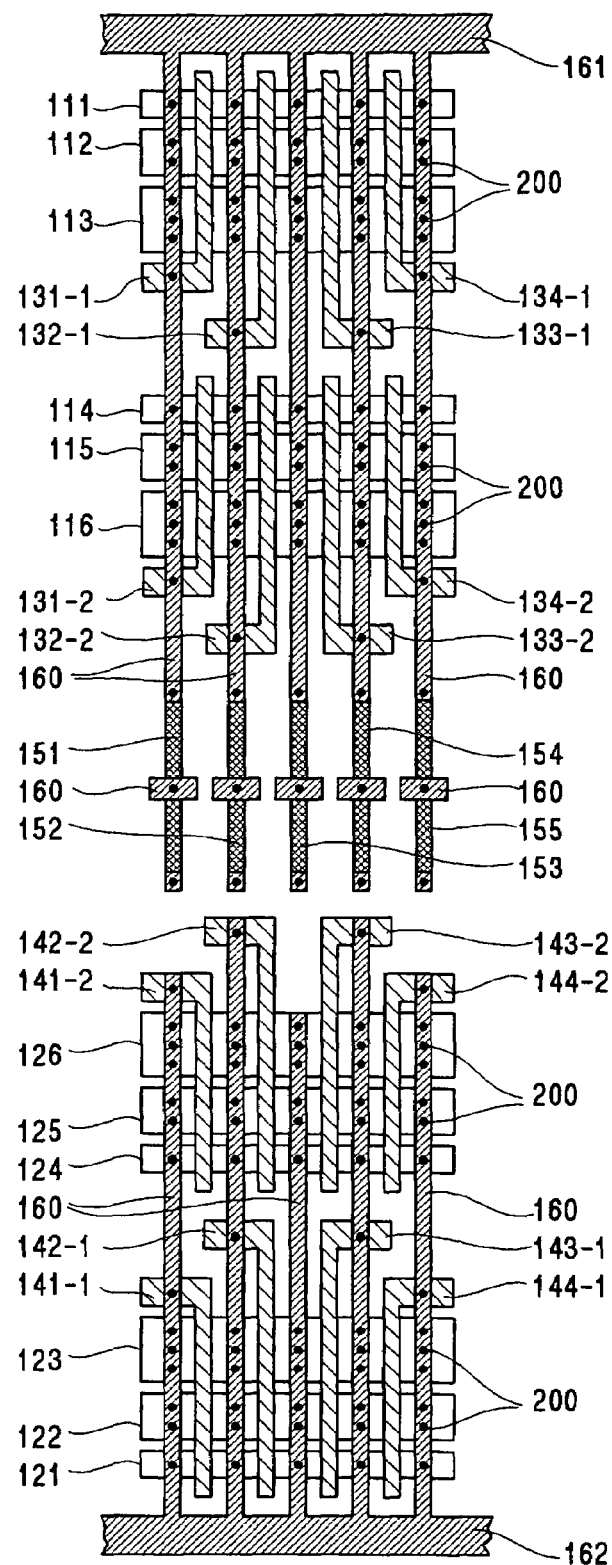
FIG. 36 is a plan view showing another structure of the spare cell region having gate electrodes which are assigned to some transistor regions among a plurality of transistor regions.
Figure 37:
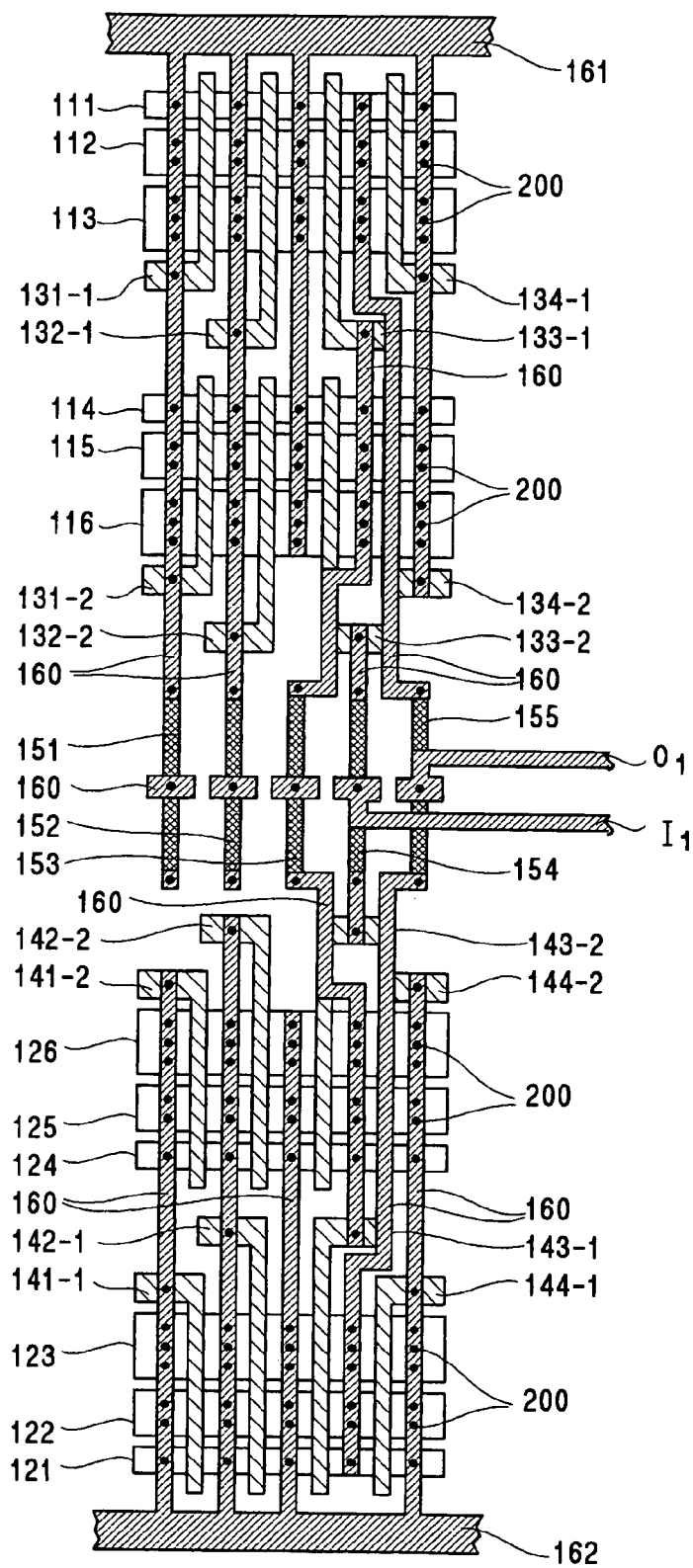
FIG. 37 is a schematic plan view showing the pattern of the main wire layer in the case where the 2-stage inverter circuits are formed in the spare cell region shown in FIG. 36.
Figure 38A:
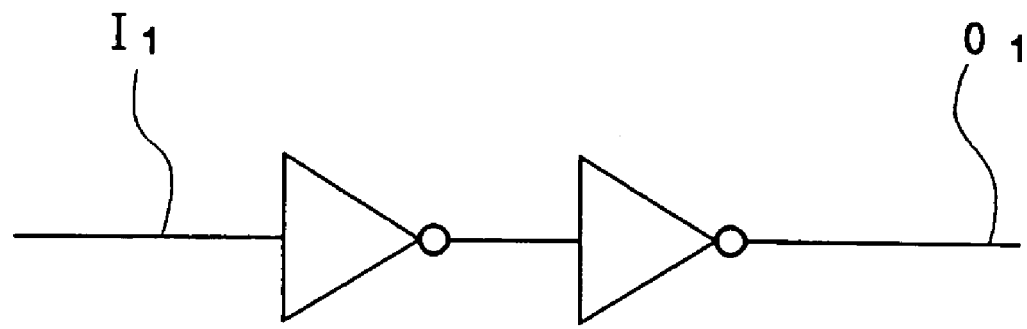
FIG. 38A is a symbol diagram of the 2-stage inverter circuits.
Figure 38B:
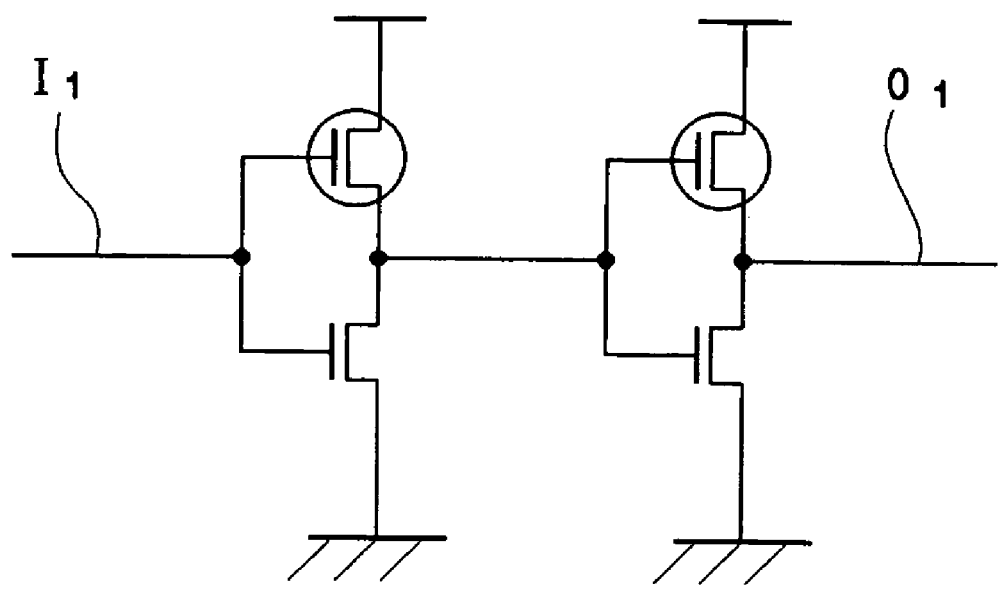
FIG. 38B is a circuit diagram of the 2-stage inverter circuits.

Further, in the above described embodiments, although each of the gate electrodes for P-channel transistors is assigned with respect to a plurality of P-channel transistor regions and each of the gate electrodes for N-channel transistors is assigned with respect to a plurality of N-channel transistor regions, the present invention is not limited to this arrangement. Therefore, as shown in FIG. 34, each gate electrode can be assigned with respect to a single transistor region. Otherwise, as shown in FIG. 35 and FIG. 36, each gate electrode can be assigned to some transistor regions among a plurality of transistor regions (six P-channel and N-channel transistor regions in FIGS. 35 and 36). In FIG. 35, each gate electrode is assigned to two transistor regions among six transistor regions. In FIG. 36, each gate electrode is assigned to three transistor regions among six transistor regions. According to such an arrangement, more complex logic circuits can be formed in the spare cell region, although the area of the spare cell region increases somewhat. In the example shown in FIG. 35, two transistor regions to which the same gate electrode is assigned have the same channel width. In the example shown in FIG. 36, three transistor regions to which the same gate electrode is assigned have different channel widths. FIG. 37 is a schematic plan view showing the pattern of the main wire layer in the case where the 2-stage inverter circuits are formed in the spare cell region shown in FIG. 36. A symbol diagram and a circuit diagram of the 2-stage inverter circuits are shown in FIG. 38A and FIG. 38B, respectively.

Furthermore, in the above described embodiments, although the main wires are already located at the unused plug electrodes, these main wires can be eliminated. Therefore, it is not necessary for the unused bypass wires to be actually connected to the main wire layer so long as the bypass wires have a structure that can be connected to the main wire layer at least two points. This arrangement can also be applied to the diffusion regions and gate electrodes. Therefore, it is not necessary for the unused diffusion regions or unused gate electrodes to be actually connected to the main wire layer so long as they have a structure that can be connected to the main wire layer. In the present invention, "Structure that can be connected" means that at least a contact hole is provided, which may or may not be filled by a plug electrode.

What is claimed is:

1. A semiconductor integrated circuit device, comprising:
    a main region on which a main circuit is formed; and
    a spare cell region for logic modification of the circuit formed on the main region,
    said spare cell region including a P-channel transistor region, an N-channel transistor region, a plurality of gate electrodes provided above the P-channel transistor region and the N-channel transistor region, a main wire layer that is a different layer from the gate electrodes, and a plurality of bypass wires that are formed at a different layer from the main wire layer,
    each of said plurality of bypass wires having a structure that can be connected to the main wire layer at more than one point through contact holes formed in a dielectric layer intervening between the main wire layer and the bypass wires.

2. The semiconductor integrated circuit device as claimed in claim 1, wherein said main wire layer includes a portion that intersects with the bypass wires.

3. The semiconductor integrated circuit device as claimed in claim 1, wherein said bypass wires are formed at a layer different from the gate electrodes.

4. The semiconductor integrated circuit device as claimed in claim 3, wherein said main wire layer is a layer above the layer at which the bypass wires are formed.

5. The semiconductor integrated circuit device as claimed in claim 1, wherein a diffusion region that is included in the P-channel transistor region and a diffusion region that is included in the N-channel transistor region are connected to the main wire layer.

6. The semiconductor integrated circuit device as claimed in claim 5, wherein portions of the main wire layer connected to the diffusion regions are spaced so that a wire of the main wire layer used for wiring can pass.

7. The semiconductor integrated circuit device as claimed in claim 1, wherein all gate electrodes are connected to the main wire layer.

8. The semiconductor integrated circuit device as claimed in claim 7, wherein portions of the main wire layer connected to the gate electrodes are spaced so that a wire of the main wire layer used for wiring can pass.

9. The semiconductor integrated circuit device as claimed in claim 1, wherein said bypass wires are provided in parallel with the gate electrodes.

10. The semiconductor integrated circuit device as claimed in claim 1, wherein said plurality of bypass wires have a structure that can be connected to the main wire layer at more than two point through contact holes formed in the dielectric layer.

11. The semiconductor integrated circuit device as claimed in claim 1, wherein said spare cell region includes a plurality of P-channel transistor regions and plurality of N-channel transistor regions,
    the gate electrodes for the P-channel transistor regions being provided with respect to the plurality of P-channel transistor regions in common, and the gate electrodes for the N-channel transistor regions being provided with respect to the plurality of N-channel transistor regions in common.

12. The semiconductor integrated circuit device as claimed in claim 11, wherein at least two P-channel transistor regions have a different channel width from each other, and at least two N-channel transistor regions have a different channel width from each other.

13. A semiconductor integrated circuit device, comprising:
    a plurality of P-channel transistor regions whose channel widths are different from each other;
    a plurality of N-channel transistor regions whose channel widths are different from each other;
    a plurality of gate electrodes for P-channel transistors located across the P-channel transistor regions;
    a plurality of gate electrodes for N-channel transistors located across the N-channel transistor regions;
    a plurality of bypass wires located between the P-channel transistor regions and the N-channel transistor regions; and
    a main wire layer formed at a different layer from that on which the bypass wires are formed,
    each of said plurality of bypass wires having a structure that can be connected to the main wire layer at more than one point.

14. The semiconductor integrated circuit device as claimed in claim 13, wherein said plurality of P-channel transistor regions include at least three P-channel transistor regions whose channel widths are different from each other, said plurality of N-channel transistor regions include at least three N-channel transistor regions whose channel widths are different from each other.

15. The semiconductor integrated circuit device as claimed in claim 13, wherein said plurality of gate electrodes for P-channel transistors are located in parallel with a substantially constant pitch, said plurality of gate electrodes for N-channel transistors are located in parallel with a substantially constant pitch, and said plurality of bypass wires are located in parallel with the gate electrodes with substantially the same pitch as the gate electrodes.

16. The semiconductor integrated circuit device as claimed in claim 13, wherein diffusion regions that are included in the P-channel transistor regions, other diffusion regions that are included in the N-channel transistor region, said plurality of gate electrodes for P-channel transistors, and said plurality of gate electrodes for N-channel transistors have a structure that can be connected to the main wire layer.

17. The semiconductor integrated circuit device as claimed in claim 13, wherein each of said plurality of bypass wires have a structure that can be connected to the main wire layer at more than two points.

18. A semiconductor integrated circuit device, comprising:
a P-channel transistor region;
an N-channel transistor region;
a plurality of gate electrodes for P-channel transistors formed on the P-channel transistor region arranged in parallel with a predetermined constant pitch;
a plurality of gate electrodes for N-channel transistors formed on the N-channel transistor region arranged in parallel with said predetermined constant pitch;
a plurality of bypass wires located between the P-channel transistor region and the N-channel transistor region arranged in parallel with said predetermined constant pitch; and
a main wire layer formed at a different layer from that on which the bypass wires are formed,
each of said plurality of bypass wires having a structure that can be connected to the main wire layer at more than one point.

19. The semiconductor integrated circuit device as claimed in claim 18, wherein portions of the main wire layer connected to diffusion regions that is included in the P-channel transistor region are spaced so that a wire of the main wire layer used for wiring can pass, and other portions of the main wire layer connected to diffusion regions that is included in the N-channel transistor region are spaced so that a wire of the main wire layer used for wiring can pass.

20. The semiconductor integrated circuit device as claimed in claim 18, wherein portions of the main wire layer connected to the gate electrodes for P-channel transistors are spaced so that a wire of the main wire layer used for wiring can pass, and portions of the main wire layer connected to the gate electrodes for N-channel transistors are spaced so that a wire of the main wire layer used for wiring can pass.

* * * * *